(12) United States Patent
Imanaka et al.

(10) Patent No.: US 12,289,115 B2
(45) Date of Patent: Apr. 29, 2025

(54) SEMICONDUCTOR DEVICE

(71) Applicant: Renesas Electronics Corporation, Tokyo (JP)

(72) Inventors: Yusuke Imanaka, Tokyo (JP); Atsushi Motozawa, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 18/307,475

(22) Filed: Apr. 26, 2023

(65) Prior Publication Data
US 2023/0387924 A1 Nov. 30, 2023

(30) Foreign Application Priority Data
May 27, 2022 (JP) .................. 2022-086908

(51) Int. Cl.
*H03L 7/099* (2006.01)
*H03L 7/197* (2006.01)
(52) U.S. Cl.
CPC .......... *H03L 7/0998* (2013.01); *H03L 7/1974* (2013.01)

(58) Field of Classification Search
None
See application file for complete search history.

(56) References Cited

U.S. PATENT DOCUMENTS

2008/0181347 A1 7/2008 Nakamura

FOREIGN PATENT DOCUMENTS

JP 2008187556 A 8/2008

*Primary Examiner* — Cassandra F Cox
(74) *Attorney, Agent, or Firm* — SCULLY, SCOTT, MURPHY & PRESSER, P.C.

(57) ABSTRACT

A semiconductor device includes a phase interpolation circuit including an N-bit current digital-analog conversion circuit, a switch circuit, a capacitive element, an inverter, and a control logic circuit. The control logic circuit detects an end of a phase interpolation operation by using an output result of the inverter and outputs a first control signal for turning off the current digital-analog conversion circuit. Also, the control logic circuit detects the end of the phase interpolation operation by using the output result of the inverter and outputs a second control signal for turning off the inverter.

8 Claims, 24 Drawing Sheets

_US 12,289,115 B2_

SEMICONDUCTOR DEVICE

CROSS-REFERENCE TO RELATED APPLICATIONS

The subject application claims priority under 35 U.S.C. § 119 to Japanese Patent Application No. 2022-086908, filed on May 27, 2022. The disclosure of Japanese Patent Application No. 2022-086908 including the specification, drawings and abstract is incorporated herein by reference in its entirety.

BACKGROUND

This disclosure relates to a semiconductor device and is a technique particularly effective when applied to a semiconductor device having a phase interpolation circuit.

There is disclosed a technique listed below.
[Patent Document 1] Japanese Unexamined Patent Application Publication No. 2008-187556

As a phase locked loop (PLL) circuit used in a semiconductor device, a fractional multiplication PLL circuit (referred to also as fractional PLL circuit) having a fractional frequency divider has been known. The fractional PLL circuit has a function to generate a fractional clock obtained by fractional multiplication of an input clock signal. For example, Japanese Unexamined Patent Application Publication No. 2008-187556 proposes a fractional PLL circuit.

SUMMARY

The disclosers have studied a phase interpolation circuit of a fractional frequency divider. This phase interpolation circuit does not have a known circuit configuration but has a circuit configuration studied by the disclosers. This phase interpolation circuit is composed of an analog circuit obtained by combining a plurality of current sources (current DAC including N current switches), a capacitive element, and an inverter, and has a high-accuracy and high-resolution configuration.

As a result of studies by the disclosers, it has been found that the accuracy of phase interpolation is deteriorated due to fluctuation of bias voltage (VB) of the gate of the MOSFET constituting the current source. Also, in order to suppress the fluctuation of the bias voltage (VB), the configuration of connecting a stabilizing capacitor (Cs) to the gate of the MOSFET constituting the current source has been studied, but it has been found that the area increases due to the necessity of a large stabilizing capacitor and the time constant increases due to the stabilizing capacitor (Cs), which makes high-speed operation difficult. It has also been found that jitter increases when high-speed operation cannot be performed.

An object of this disclosure is to provide a semiconductor device including a phase interpolation circuit with a small area and capable of operating at a high speed.

Other problems and novel features will become apparent from the description of this specification and the accompanying drawings.

An outline of the representative embodiment of this disclosure will be briefly described below.

A semiconductor device according to an embodiment includes a phase interpolation circuit having an N-bit current digital-analog conversion circuit, a switch circuit, a capacitive element, an inverter, and a control logic circuit. The control logic circuit detects the end of a phase interpolation operation by using an output result of the inverter and outputs a first control signal for turning off the current digital-analog conversion circuit.

With the semiconductor device according to the above-described embodiment, it is possible to provide a semiconductor device including a phase interpolation circuit with a small area and capable of operating at a high speed.

DETAILED DESCRIPTION

Figure 1:
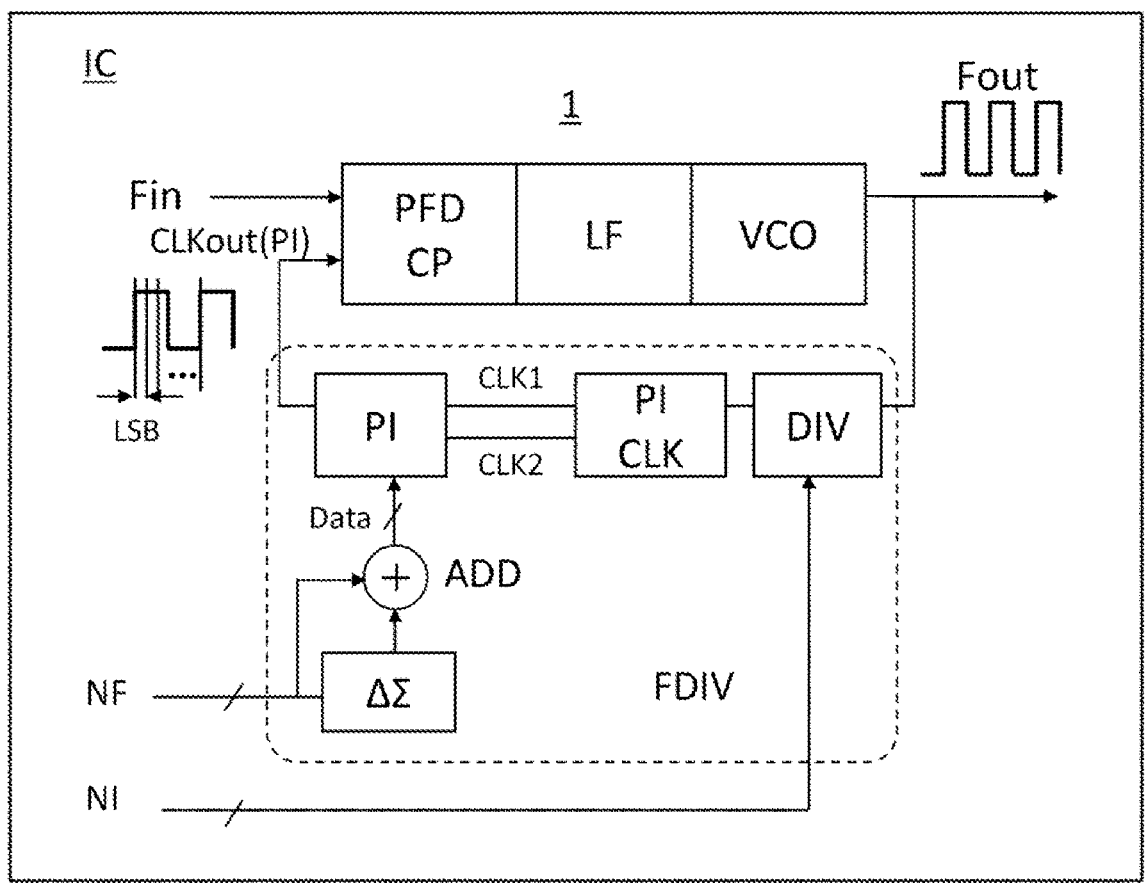
FIG. 1 is a block diagram of a phase locked loop circuit (PLL) including a phase interpolation circuit (PI) according to an example.

Hereinafter, examples will be described with reference to the drawings. However, in the following description, the same components are denoted by the same reference characters, and repetitive description thereof will be omitted in some cases. In order to make the description clearer, the drawings may be schematically illustrated as compared with the actual embodiment, but they are merely examples and do not limit the interpretation of the present invention.

First Example

Figure 2:
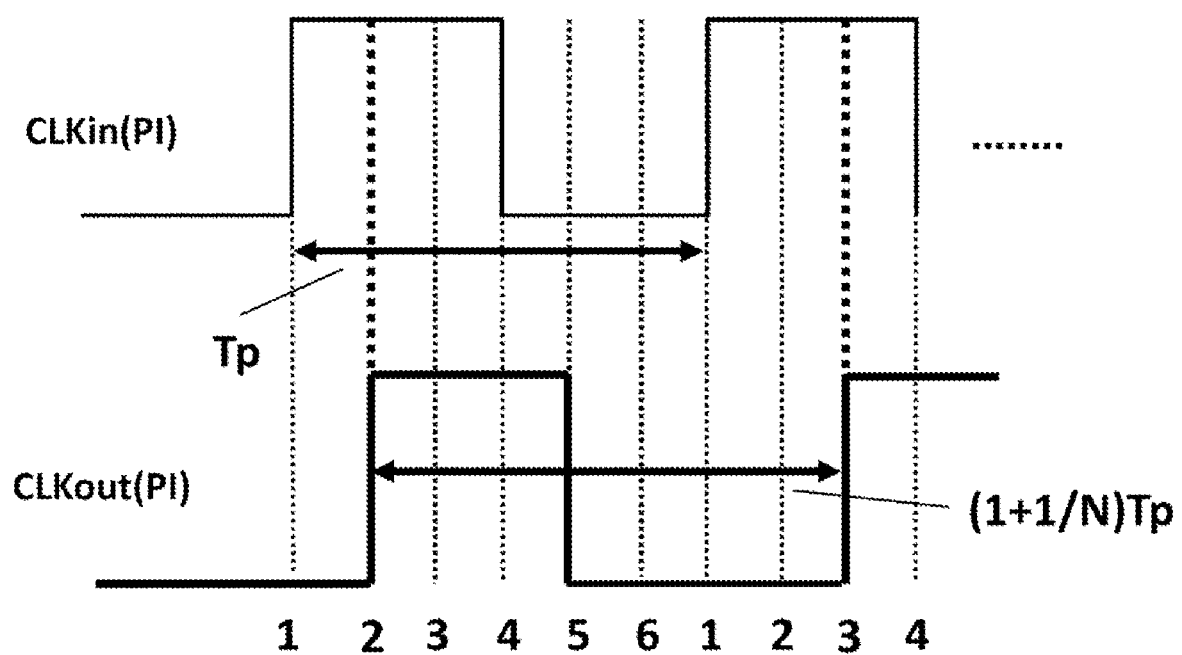
FIG. 2 is a diagram for describing an operation of the phase interpolation circuit (PI) in FIG. 1.
Figure 3:
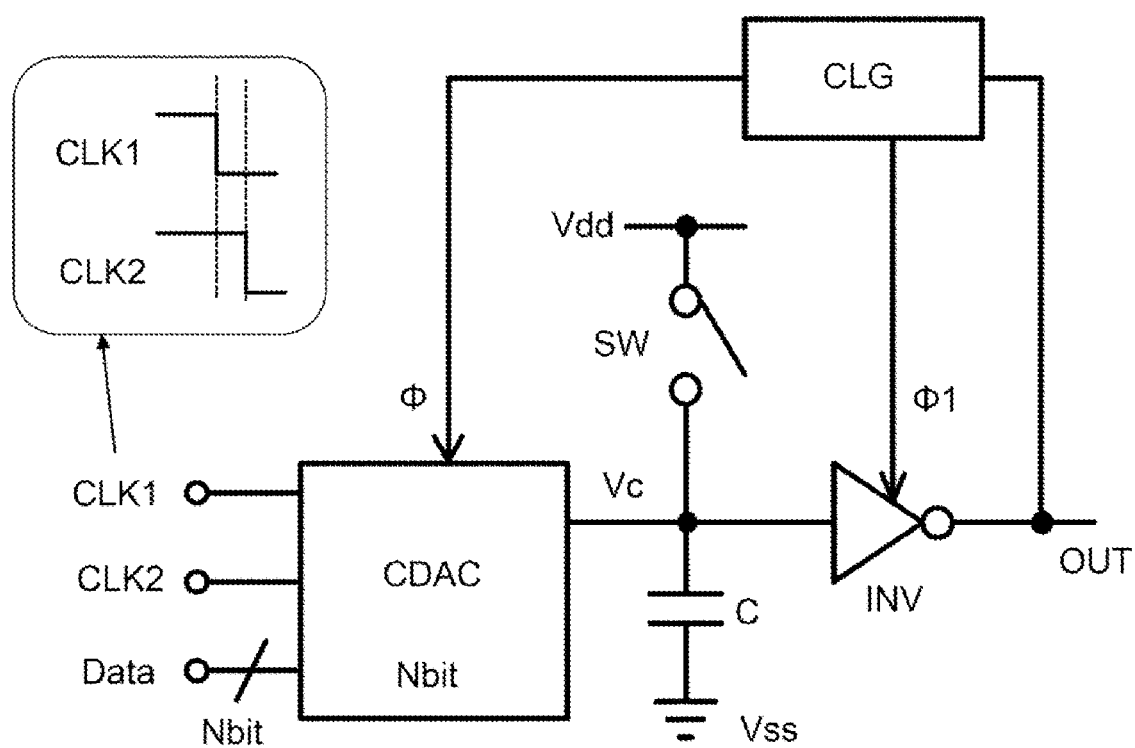
FIG. 3 is a diagram illustrating a circuit configuration of the phase interpolation circuit (PI) in FIG. 1.
Figure 4:
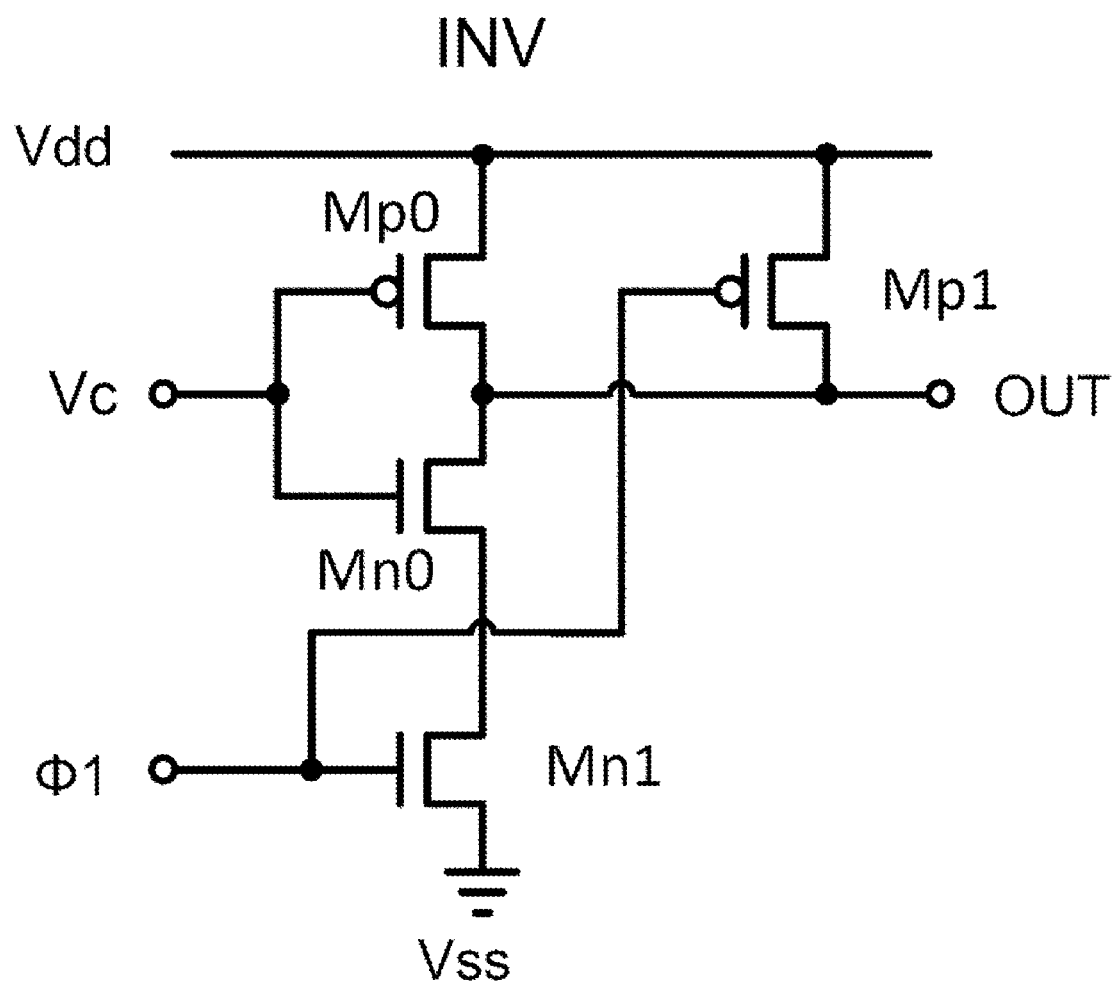
FIG. 4 is a diagram for describing a circuit configuration of an inverter in FIG. 3.
Figure 5:
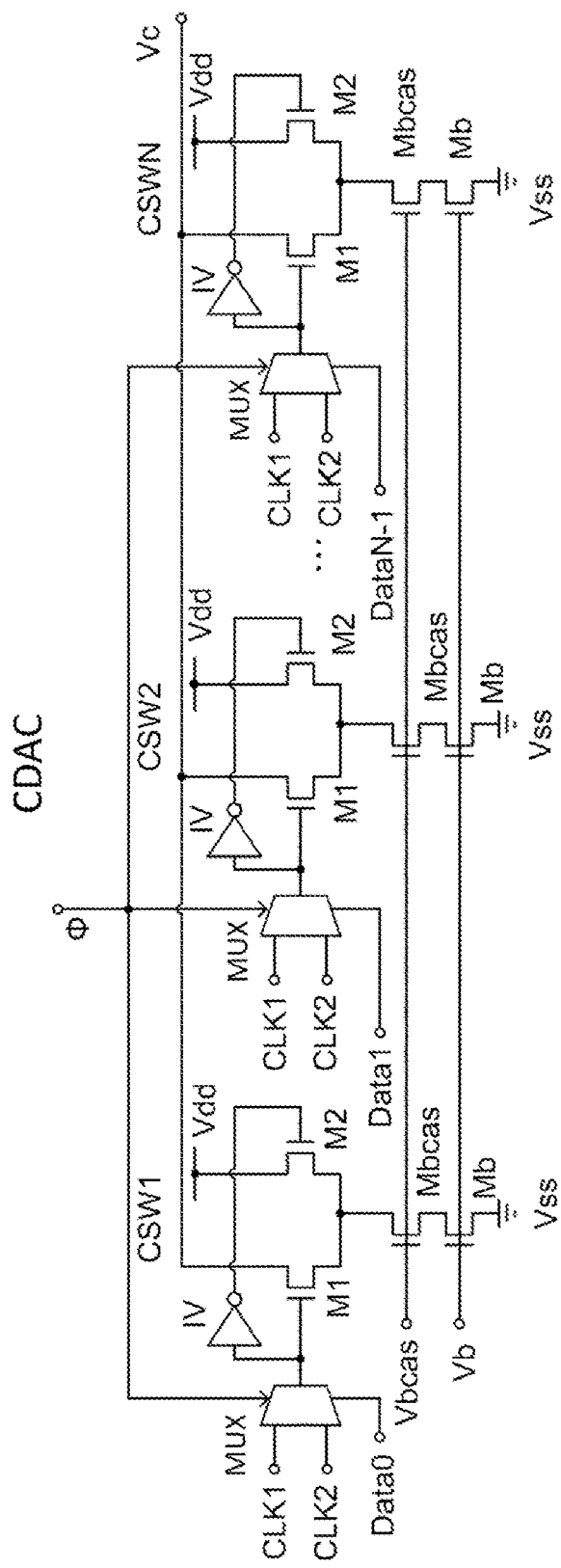
FIG. 5 is a diagram for describing a circuit configuration of a current DAC (CDAC) in FIG. 3.

FIG. 1 is a block diagram of a phase locked loop circuit (PLL) including a phase interpolation circuit (PI) according to an example. FIG. 2 is a diagram for describing an operation of the phase interpolation circuit (PI) in FIG. 1. FIG. 3 is a diagram illustrating a circuit configuration of the phase interpolation circuit (PI) in FIG. 1. FIG. 4 is a diagram for describing a circuit configuration of an inverter in FIG. 3. FIG. 5 is a diagram for describing a circuit configuration of a current DAC (CDAC) in FIG. 3.

FIG. 1 illustrates a phase locked loop circuit (hereinafter, referred to as PLL) 1 formed in a semiconductor device IC or a semiconductor chip. The output of the phase locked loop circuit 1 is used for, for example, clock signals during operation of a signal processing device or a communication device formed in a semiconductor device.

The phase locked loop circuit 1 is a fractional multiplication PLL circuit (referred to also as fractional PLL circuit) including a fractional frequency divider FDIV. The PLL circuit 1 includes a phase frequency detector (phase comparator (PFD)), a charge pump CP, a loop filter (LF), a voltage controlled oscillator (VCO), and a fractional frequency divider FDIV. The fractional frequency divider FDIV includes a frequency divider DIV, a phase interpolation circuit PI, a PI clock generation circuit PICLK, a ΔΣ modulation circuit (ΔΣ), and an adder ADD.

The PLL circuit 1 controls the voltage controlled oscillator VCO to generate an output clock Fout such that the phase of an input clock Fin is synchronized with the phase of an output clock CLKout(PI) of the phase interpolation circuit PI. The loop filter (LF) can be of either a passive type or an active type. The voltage controlled oscillator VCO can be of either an LC type or a ring type.

The fractional frequency divider FDIV divides the frequency of the output clock Fout at a frequency setting capable of comparing the phase of the input clock Fin. In this case, a fractional frequency divider (ΔΣ type fractional N) is used as an example. However, any frequency divider other than the fractional frequency divider may be used as long as the frequency divider has a similar function, that is, a function of switching the frequency division number in a time division manner and dividing the frequency of a signal in a fraction on average. The fractional frequency divider switches (dynamically switches) the plurality of frequency division numbers in a time division manner, and consequently divides the frequency of a signal in a fraction.

The frequency divider DIV divides the frequency of the output clock Fout by a frequency division number of integer NI. The PI clock generation circuit PICLK generates a first clock CLK1 and a second clock CLK2 based on the output clock signal of the frequency divider DIV, and supplies the first clock CLK1 and the second clock CLK2 to the phase interpolation circuit PI.

The ΔΣ modulation circuit (ΔΣ) increasingly disperses the frequency division numbers to be switched in the fractional frequency divider FDIV. The ΔΣ modulation circuit (ΔΣ) indicates a fraction (decimal point) portion and thus is configured to receive a frequency division number NF. The adder ADD adds up the output of the ΔΣ modulation circuit (ΔΣ) and the frequency division number NF, and outputs multi-bit data Data to the phase interpolation circuit PI. The phase interpolation circuit PI performs phase interpolation on the basis of the data Data to generate an output clock CLKout(PI), and supplies the same to the phase comparator PFD.

The phase comparator PFD compares the phase of the input clock Fin output from the original oscillator (not illustrated) and the phase of the output clock CLKout(PI) subjected to the frequency division by the fractional frequency divider FDIV, and outputs an up-signal and a down-signal whose pulse width is set based on the compared phase difference.

The charge pump CP outputs a charge pump output voltage based on the up-signal and the down-signal output from the phase comparator PFD. The loop filter LF outputs a filter voltage from which noise of the output voltage of the charge pump CP has been removed. The voltage controlled oscillator VCO generates an output clock Fout based on the filter voltage.

FIG. 2 illustrates an outline of the operation of the phase interpolation circuit PI. In the input clock CLKin(PI) of the phase interpolation circuit PI, one cycle is Tp, and one cycle Tp is configured of six periods (1 to 6) in this example. In this example, the input clock CLKin(PI) rises from the low level to the high level in the period 1, and falls from the high level to the low level in the period 4.

On the other hand, in this example, the output clock CLKout(PI) of the phase interpolation circuit PI rises from the low level to the high level in the period 2, falls from the high level to the low level in the period 5, and then rises from the low level to the high level in the period 4. One cycle of the output clock CLKout(PI) of the phase interpolation circuit PI is set as (1+1/N)Tp, and the input clock CLKin(PI) is divided into N to realize fractional frequency division (1/N).

As illustrated in FIG. 3, the phase interpolation circuit PI includes an N-bit current digital-analog conversion circuit (hereinafter, referred to as CDAC), a switch circuit SW, a capacitive element C, an inverter INV, and a control logic circuit CLG.

The CDAC is configured to receive the first clock CLK1, the second clock CLK2, and the N-bit data Data. The CDAC is configured to output a voltage Vc based on the first clock CLK1, the second clock CLK2, and the N-bit data Data.

The switch circuit SW and the capacitive element C are connected in series between a power supply wiring to which a power supply potential Vdd as a first reference potential is supplied and a ground wiring to which a ground potential Vss as a second reference potential is supplied. The ground potential Vss takes a value smaller than the power supply potential Vdd (Vss<Vdd). The voltage Vc is supplied to a connection point between the switch circuit SW and the capacitive element C.

An input of the inverter INV is connected to the connection point between the switch circuit SW and the capacitive element C, the voltage Vc is supplied to the inverter INV, and an output signal OUT is generated from an output of the inverter INV. The output signal OUT corresponds to the output clock CLKout(PI). The inverter INV can also be regarded as a comparison circuit that compares the voltage Vc with a threshold voltage IVth, and changes the output signal OUT from the low level to the high level when detecting that the voltage Vc has become equal to or lower than the threshold voltage IVth. The inverter INV has an operation mode in which the value of the input voltage Vc is compared (when a second control signal Φ1 described later is at a high level) and a stop mode in which a fixed voltage level is output regardless of the value of the input voltage Vc (when the second control signal Φ1 described later is at a low level).

The control logic circuit CLG receives the output signal OUT at its input, monitors or determines the signal level of the output signal OUT, and outputs the first control signal Φ and the second control signal Φ1. The first control signal Φ is supplied to the CDAC, and the second control signal Φ1 is supplied to the inverter INV. The control logic circuit CLG inverts the first control signal Φ and the second control signal Φ1 from the high level that is the activation level to the low level that is the deactivation level, for example, on the basis of the signal level of the output signal OUT being inverted from the low level to the high level, for example. As a result, the CDAC that receives the control signal Φ sets the voltage Vc to the hold state. Also, the inverter INV that receives the control signal Φ1 sets the output signal OUT to the power supply potential Vdd. That is, the control logic circuit CLG detects the end of the phase interpolation operation by using the output result of the inverter INV, outputs the first control signal Φ for turning off the current digital-analog conversion circuit CDAC, and outputs the second control signal Φ1 for turning off the inverter INV.

As illustrated in FIG. 4, the inverter INV includes a P channel MOSFET Mp0, an N channel MOSFET Mn0, a P channel MOSFET Mp1, and an N channel MOSFET Mn1. The gate of the P channel MOSFET Mp0 and the gate of the N channel MOSFET Mn0 are connected in common so as to be supplied with the voltage Vc. The gate of the P channel MOSFET Mp1 and the gate of the N channel MOSFET Mn1 are connected in common so as to be supplied with the control signal Φ1. The drain-source path of the P channel MOSFET Mp0, the drain-source path of the N channel MOSFET Mn0, and the drain-source path of the N channel MOSFET Mn1 are connected in series in this order between the power supply wiring of the power supply potential Vdd and the ground wiring of the ground potential Vss. A connection point between the drain-source path of the P channel MOSFET Mp0 and the drain-source path of the N channel MOSFET Mn0 is connected so as to generate the output signal OUT. The drain-source path of the P channel MOSFET Mp1 is connected between the power supply potential Vdd and the connection point between the drain-source path of the P channel MOSFET Mp0 and the drain-source path of the N channel MOSFET Mn0.

If the control signal Φ1 is at the high level (MOSFET Mp1 is turned off and MOSFET Mn1 is turned on) and the voltage Vc is equal to or higher than the threshold potential (IVth) of the inverter INV, the MOSFET Mp0 is turned off and the MOSFET Mn0 is turned on, so that the output signal OUT is set at the low level. Also, if the voltage Vc is equal to or lower than the threshold potential (IVth) of the inverter INV, the MOSFET Mp0 is turned on and the MOSFET Mn0 is turned off, so that the output signal OUT is set at the high level.

If the control signal Φ1 is at the low level (MOSFET Mp1 is turned on and MOSFET Mn1 is turned off), the output signal OUT is set at the high level (Vdd level), and the MOSFET Mp0 and the MOSFET Mn0 are turned off. Therefore, a gate-source potential Vgs of the MOSFET Mn0 is substantially the threshold voltage Vth, and the drain-source potential Vds of the MOSFET Mn0 is equal to or lower than Vdd (Vds<Vdd). This reduces deterioration of the threshold of the MOSFET Mn0. In addition, since the control signal Φ1 is set at the low level and the output signal OUT is set at the high level (Vdd level), a malfunction can be suppressed.

As illustrated in FIG. 5, the current DAC (CDAC) includes N current switch circuits CSW1 to CSWN. Since the configuration of each of the N current switch circuits CSW1 to CSWN is the same except that the bit of the data Data input to a multiplexer MUX is different, the configuration of the current switch circuit CSW1 will be described as a representative example, and the description of the configurations of the other current switch circuits CSW2 to CSWN will be omitted.

The current switch circuit CSW1 includes a multiplexer MUX, an N channel MOSFET M1, an N channel MOSFET M2, an inverter IV, an N channel MOSFET Mbcas, and an N channel MOSFET M1.

The multiplexer MUX is configured to receive the first clock CLK1, the second clock CLK2, data Data0, and the control signal Φ. When the control signal Φ is set at the low level, the output of the multiplexer MUX is set at the low level, the MOSFET M1 is turned off, and the MOSFET M2 is turned on. When the control signal Φ is at the high level, the output of the multiplexer MUX is controlled on the basis of the first clock CLK1, the second clock CLK2, and the data Data0.

The output of the multiplexer MUX is connected to the gate of the MOSFET M1 and the input of the inverter IV. The source of the MOSFET M1 is connected to the source of the MOSFET M2, and the drain of the MOSFET M1 is connected to a connection point between the switch circuit SW and the capacitive element C to supply the voltage Vc.

The drain of the MOSFET M2 is connected to the power supply wiring to supply the power supply potential Vdd, and the gate of the MOSFET M2 is connected to the output of the inverter IV.

The drain-source path of the MOSFET Mbcas and the drain-source path of the MOSFET M1 are directly connected between the common source of the MOSFET M1 and the MOSFET M2 and the ground wiring of the ground potential Vss. The bias potential Vbcas is supplied to the gate of the MOSFET Mbcas, and the bias potential Vb is supplied to the MOSFET Mb.

Figure 6:
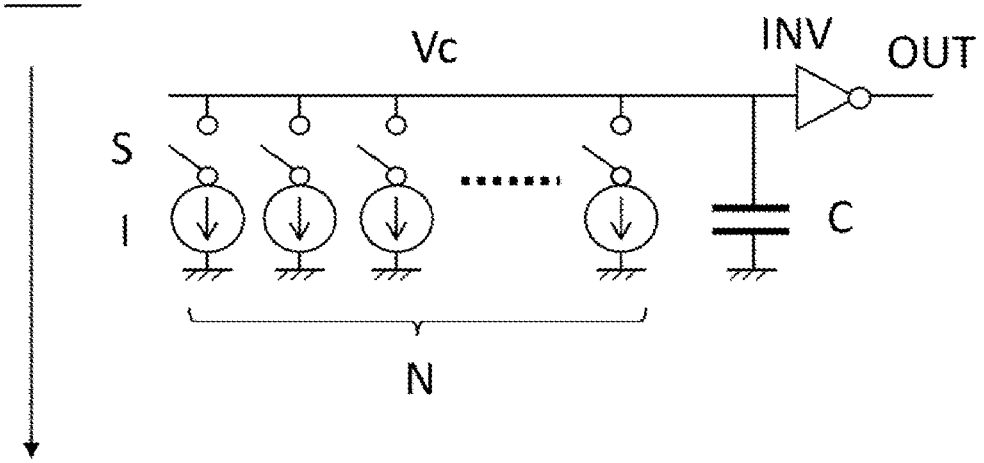
FIG. 6 is a diagram for describing an outline of the operation of the phase interpolation circuit PI.
Figure 6:
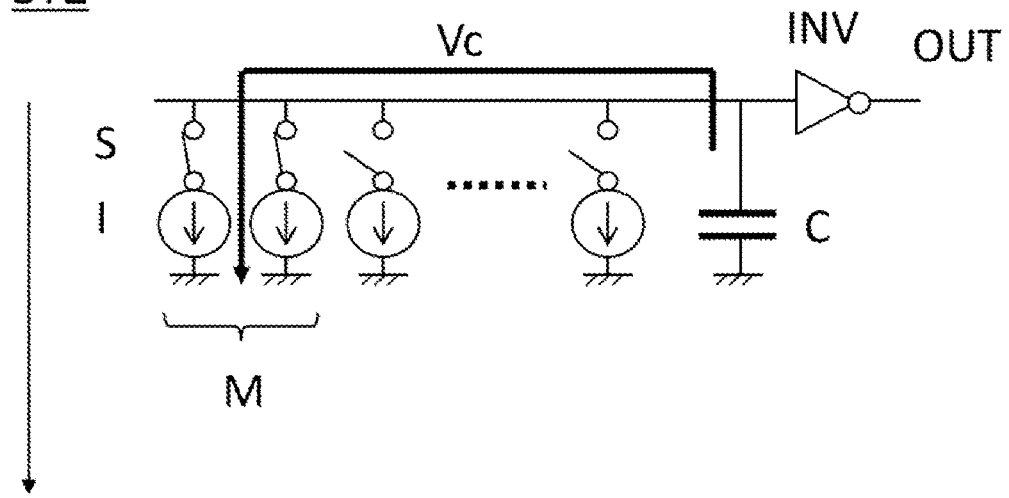
Figure 6:
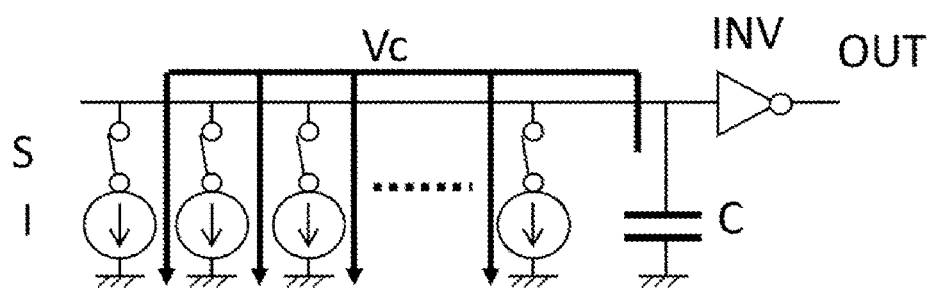
Figure 7:
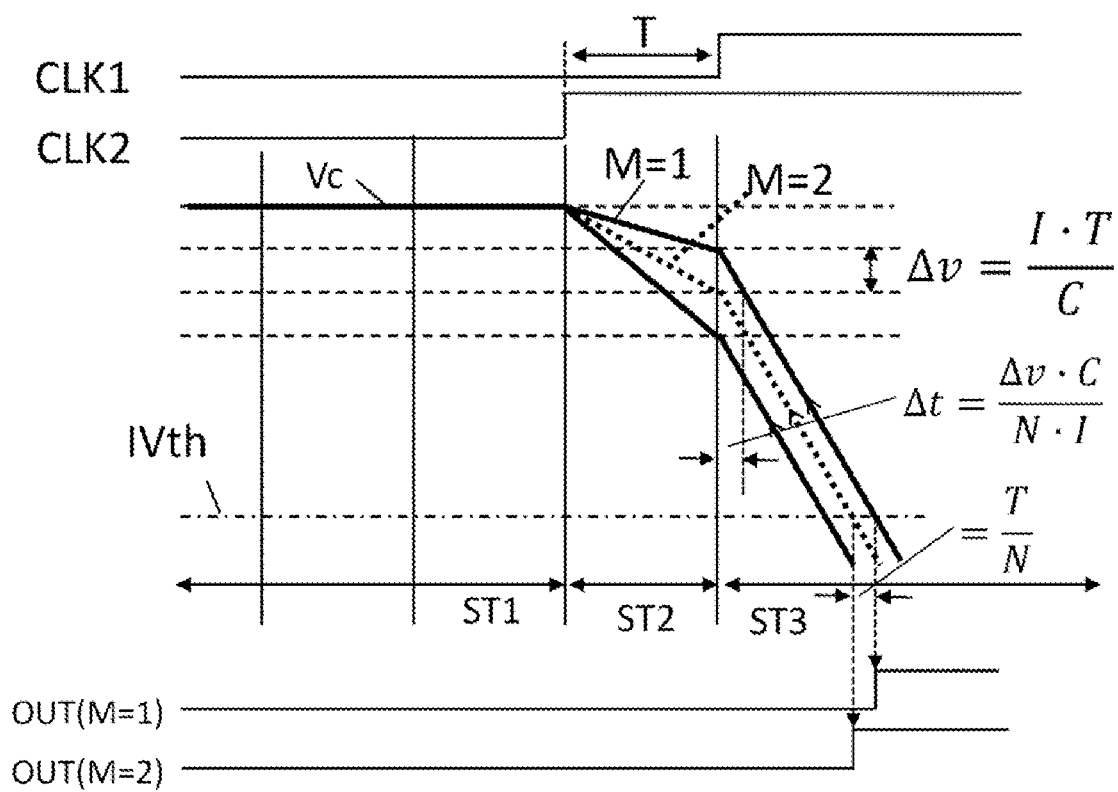
FIG. 7 is a diagram for describing a voltage Vc and an output signal OUT.

Next, the outline of the operation of the phase interpolation circuit PI will be described with reference to FIG. 6 and FIG. 7. FIG. 6 is a diagram for describing an outline of the operation of the phase interpolation circuit PI. FIG. 7 is a diagram for describing the voltage Vc and the output signal OUT. In FIG. 6, N current switch circuits CSW1 to CSWN of the current DAC (CDAC) are illustrated, and each of the current switch circuits CSW1 to CSWN has the MOSFET M1 in FIG. 5 as one switch (S) and the MOSFET Mbcas as one current source (I).

As illustrated in FIG. 6, the operation of the phase interpolation circuit PI has three states (first state ST1, second state ST2, and third state ST3).

The first state ST1 is a clock standby state in which the capacitive element C is connected to the power supply potential Vdd (the switch circuit SW in FIG. 3 is in the on state). The N switches S of the current switch circuits CSW1 to CSWN are in the off state. Therefore, the charge of the capacitive element C is retained. As illustrated in FIG. 7, in the first state ST1, the voltage Vc is at a high level (Vdd level).

The second state ST2 is a state of a first discharge operation. In the second state ST2, in this example, among the N switches S of the current switch circuits CSW1 to CSWN, M switches S are in the on state, and the N-M switches S are in the off state. Since the M switches S are turned on, the charge of the capacitive element C by the M currents I (M×I) starts to be discharged. As illustrated in FIG. 7, the second state ST2 continues for a period T, and the voltage slope at the time of discharging the charge of the capacitive element C changes according to the value of M (the number of switches S in the on state). FIG. 7 illustrates the case of M=1 and the case of M=2. A voltage difference Δv is expressed by Δv=(I·T)/C (Equation 1).

The third state ST3 is a state of a second discharge operation and output generation. In the third state ST3, all of the N switches S of the current switch circuits CSW1 to CSWN are turned on, and the charge of the capacitive element C is discharged by using the N currents I (N×I). As illustrated in the third state ST3 of FIG. 7, the voltage slope is constant regardless of the value of M. Thereafter, the voltage Vc falls below the threshold (IVth) of the inverter INV, and the output signal OUT rises. The time of crossing the threshold (IVth) of the inverter INV varies depending on the value of M. As can be seen from the output signal OUT(M=1) in the case of M=1 and the output signal OUT(M=2) in the case of M=2, the difference between the time when the output signal OUT(M=1) rises from the low level to the high level and the time when the output signal OUT(M=2) rises from the low level to the high level is T/N. That is, timing control can be performed with time resolution of T/N. T/N is calculated by the voltage difference Δv and the time difference Δt.

Since the time difference Δt is expressed by the formula of Δt=(Δv·C)/(N·I), Δt=T/N is obtained by substituting (formula 1) of the voltage difference Δv.

Next, a circuit configuration and a problem of a comparative example will be described with reference to the drawings.

Figure 8:
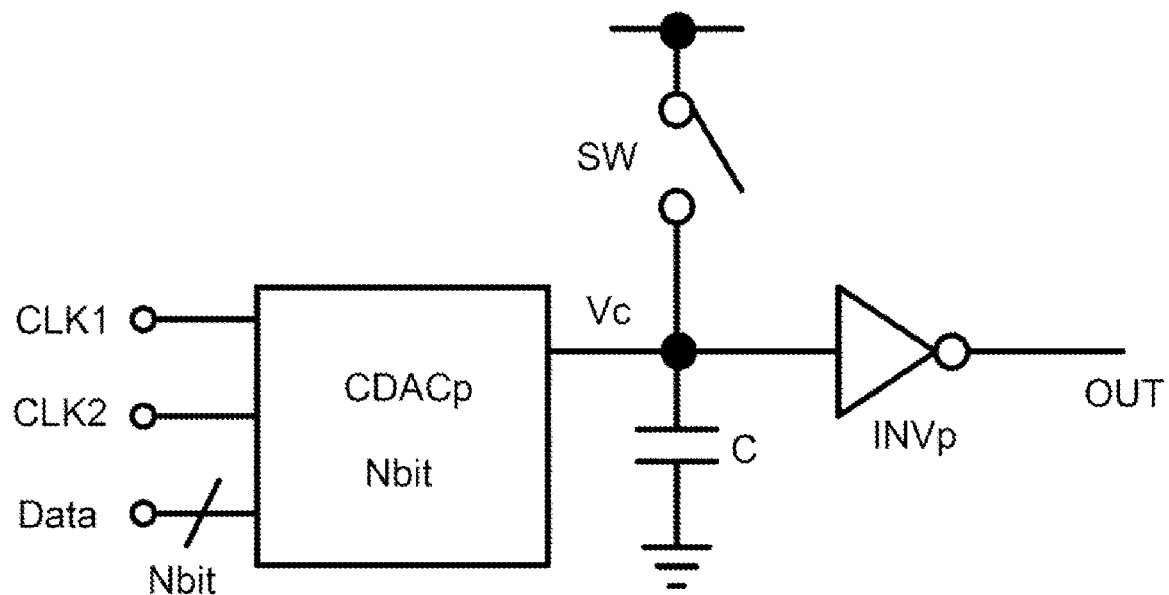
FIG. 8 is a circuit diagram of a phase interpolation circuit (PIp) according to a comparative example.
Figure 9:
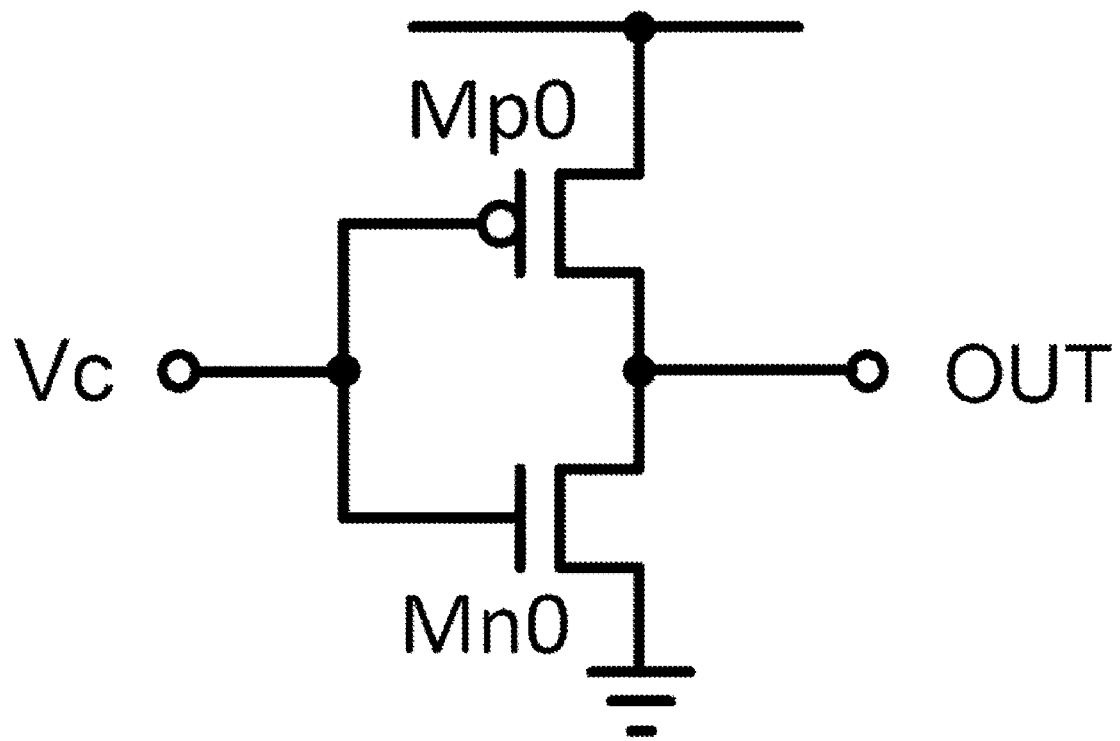
FIG. 9 is a circuit diagram of an inverter (INVp) according to the comparative example.
Figure 10:
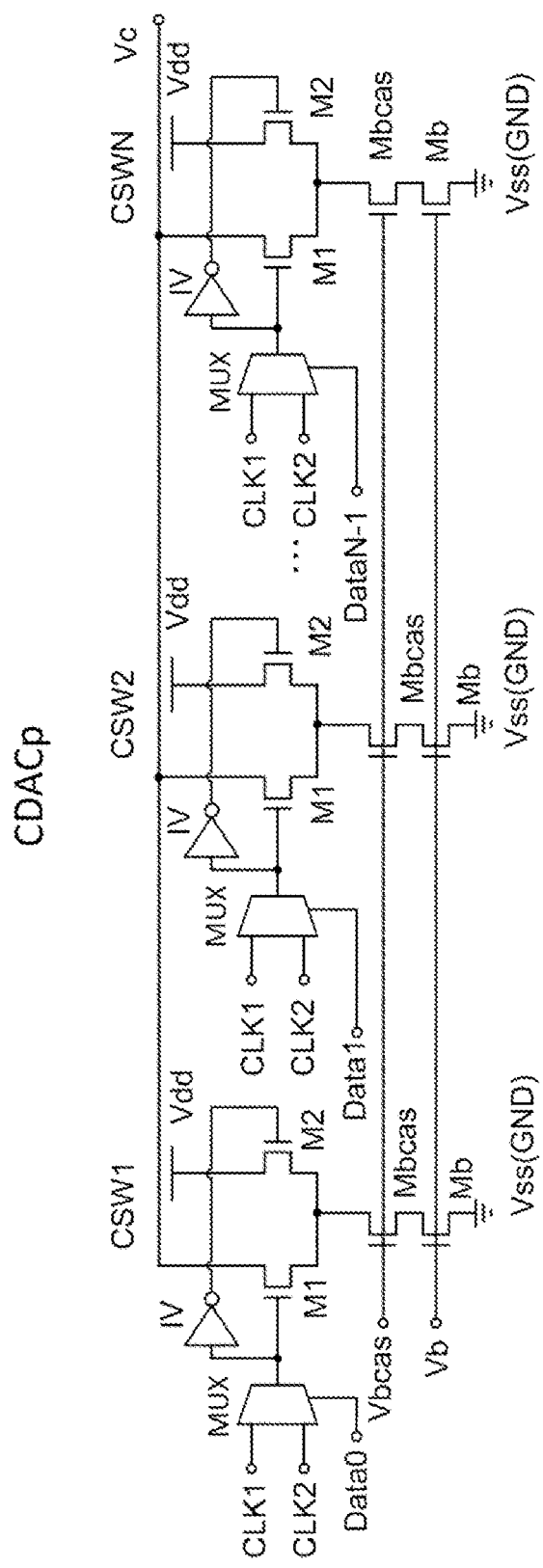
FIG. 10 is a circuit diagram of a current DAC (CDACp) according to the comparative example.

FIG. 8 is a circuit diagram of a phase interpolation circuit (PIp) according to a comparative example. FIG. 9 is a circuit diagram of an inverter (INVp) according to the comparative example. FIG. 10 is a circuit diagram of a current DAC (CDACp) according to the comparative example.

As illustrated in FIG. 8, the phase interpolation circuit PIp according to the comparative example includes an N-bit current digital-analog conversion circuit CDACp, a switch circuit SW, a capacitive element C, and an inverter INVp. However, the phase interpolation circuit PIp is not provided with the control logic circuit CLG that generates the first control signal Φ and the second control signal Φ1 illustrated in FIG. 3.

As illustrated in FIG. 9, the inverter INVp according to the comparative example includes a P channel MOSFET Mp0 and an N channel MOSFET Mn0. The inverter INVp is not provided with the P channel MOSFET Mp1 and the N channel MOSFET Mn1 illustrated in FIG. 4 to which the second control signal Φ1 is supplied.

As illustrated in FIG. 10, the current DAC (CDACp) includes N current switch circuits CSW1 to CSWN. The first control signal Φ supplied to the multiplexer MUX illustrated in FIG. 5 is not supplied to a multiplexer MUX of the current DAC (CDACp).

Figure 11:
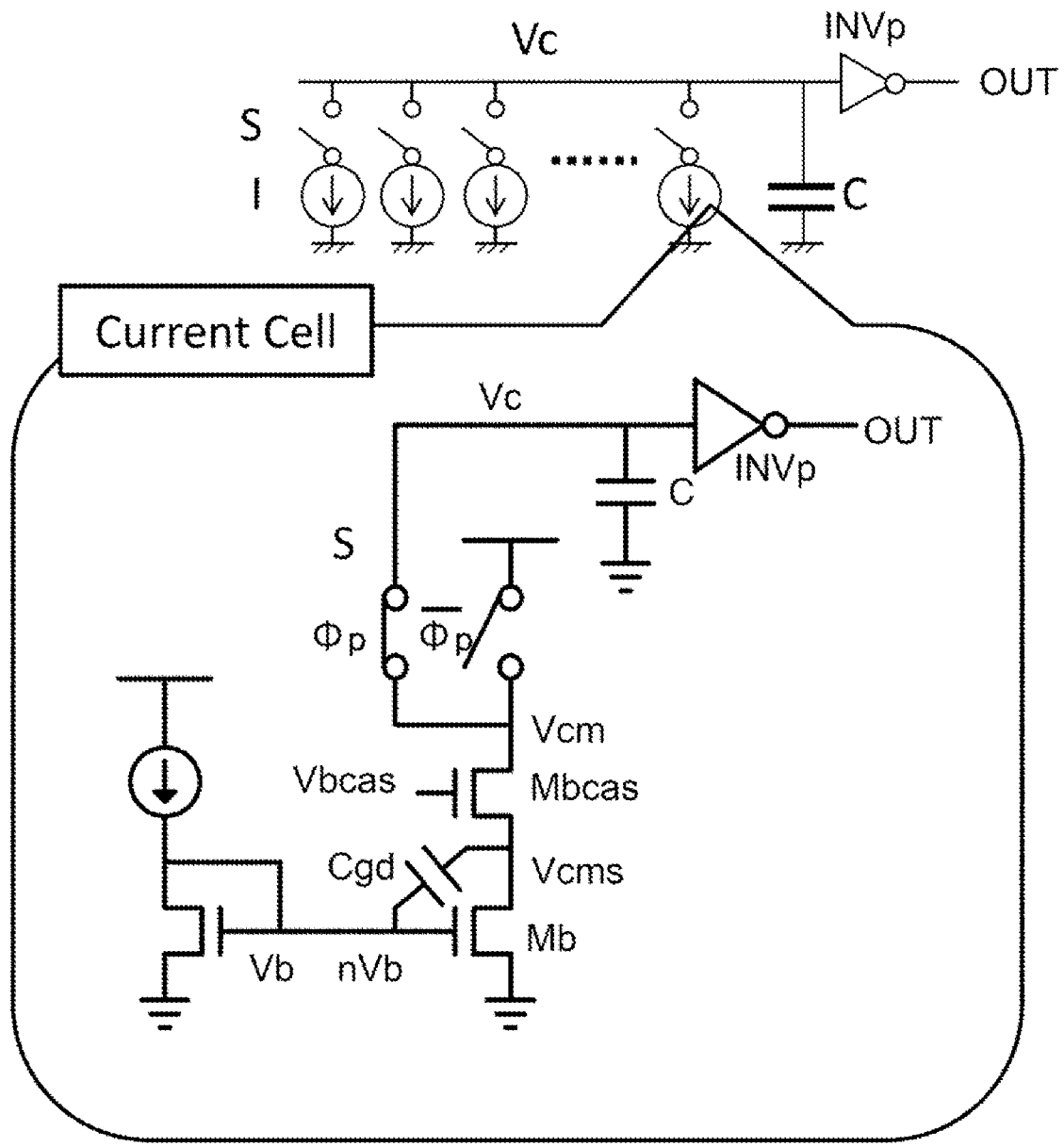
FIG. 11 is a diagram illustrating an equivalent circuit of the phase interpolation circuit (PIp) according to the comparative example.

FIG. 11 is a diagram illustrating an equivalent circuit of the phase interpolation circuit (PIp) according to the comparative example. In FIG. 8, the N current switch circuits CSW1 to CSWN of the current DAC (CDACp) are illustrated, and each of the current switch circuits CSW1 to CSWN has the MOSFET M1 in FIG. 10 as one switch (S) and the MOSFET Mbcas as one current source (I). Further, FIG. 8 illustrates, as an enlarged view, a circuit configuration of one current switch circuit CSW, an inverter INVp, and a capacitive element C (switch circuit SW is not illustrated).

Figure 12:
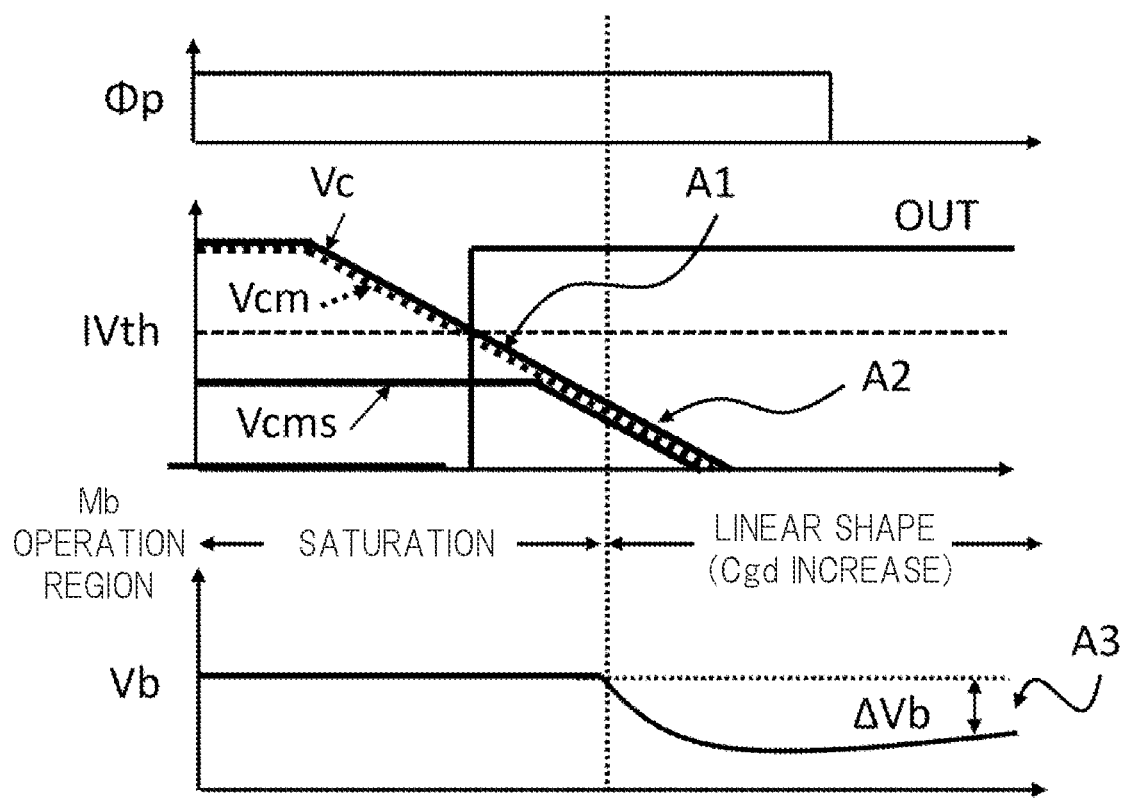
FIG. 12 is a diagram for describing a problem of the phase interpolation circuit (PIp) according to the comparative example in FIG. 11.
Figure 13:
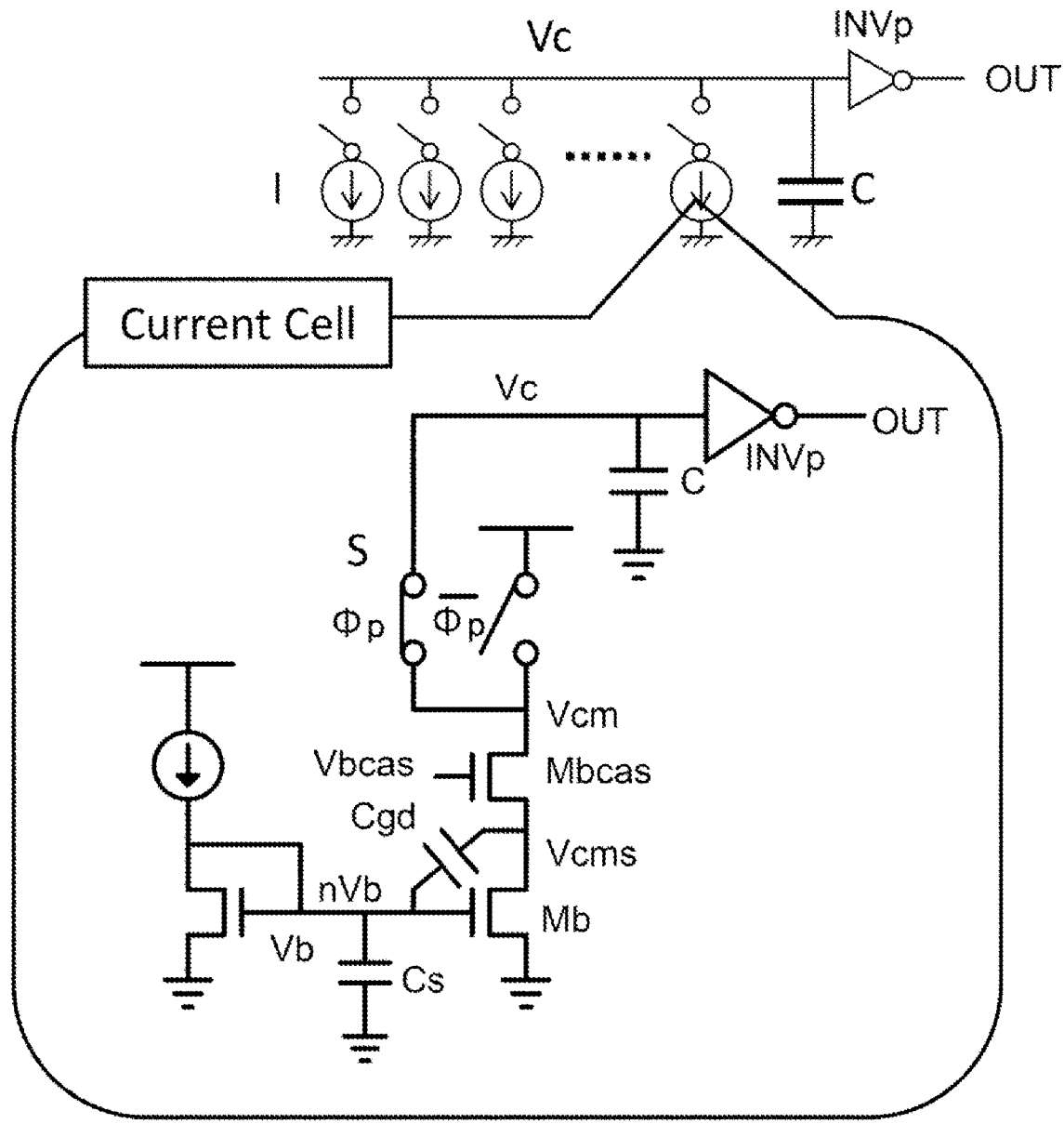
FIG. 13 is a diagram illustrating an equivalent circuit in a case where a stabilizing capacitor Cs is provided in the phase interpolation circuit (PIp) in FIG. 11.

FIG. 12 is a diagram for describing a problem of the phase interpolation circuit (PIp) according to the comparative example in FIG. 11. FIG. 12 illustrates a control signal Φp, changes in voltages (Vc, Vcm, and Vcms), a gate bias potential Vb of the MOSFET Mb, and an operation region of the MOSFET Mb of FIG. 11. FIG. 13 illustrates an equivalent circuit in a case where a stabilizing capacitor Cs is provided in the phase interpolation circuit (PIp) in FIG. 11.

As illustrated in FIG. 12, (A1) the voltage Vc decreases and the voltage Vc continues to decrease even after the output signal OUT of the inverter INVp is inverted. (A2) As the voltage Vc continues to decrease, the voltage Vcms also eventually decreases. (A3) The voltage Vcms decreases and the MOSFET Mb operates in the linear region. Since a gate-drain capacitance Cgd of the MOSFET Mb increases, the bias voltage Vb applied to the gate of the MOSFET Mb fluctuates (ΔVb). As a result, the fluctuation (ΔVb) of the bias voltage Vb remains until the start of the next phase interpolation operation, and the accuracy of the phase interpolation of the phase interpolation circuit (PIp) deteriorates.

In order to solve the problem of the fluctuation ΔVb of the bias voltage Vb, a stabilizing capacitor Cs may be connected between the gate of the MOSFET Mb and the ground wiring of the ground potential Vss. FIG. 13 illustrates an equivalent circuit in a case where the stabilizing capacitor Cs is provided in the phase interpolation circuit (PIp) in FIG. 11.

Figure 14:
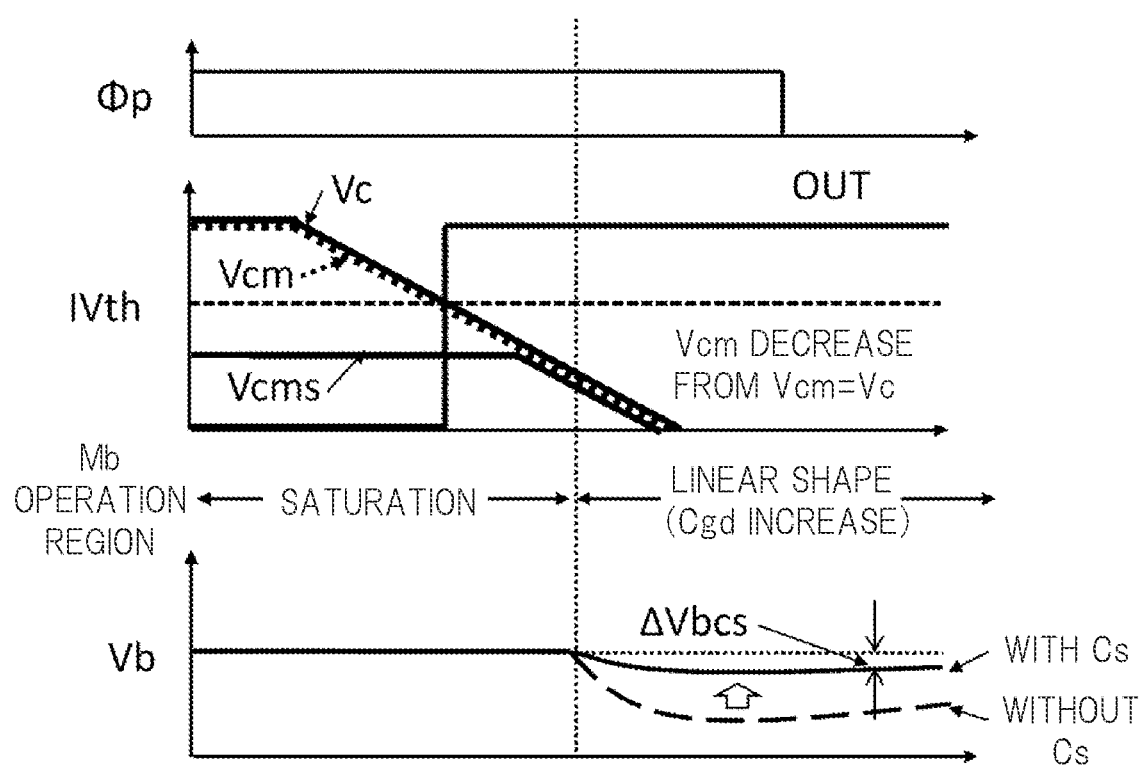
FIG. 14 is a diagram for describing an operation waveform of the phase interpolation circuit (PIp) according to the comparative example in FIG. 13.

FIG. 14 is a diagram for describing an operation waveform of the phase interpolation circuit (PIp) according to the comparative example in FIG. 13.

By connecting the stabilizing capacitor Cs between the gate of the MOSFET Mb and the ground wiring of the ground potential Vss as illustrated in FIG. 13, it is possible to suppress the magnitude of the fluctuation (ΔVbcs) of the bias voltage Vb as compared with the magnitude of the fluctuation (ΔVb) of the bias voltage Vb in FIG. 12, as illustrated in FIG. 14.

However, if the stabilizing capacitor Cs is provided, the following problems are also conceivable.
(1) Since the stabilizing capacitor Cs having a large capacitance value is required, the area of the phase interpolation circuit increases.
(2) Since the time constant of a bias node (nVb) of the bias voltage Vb increases due to the stabilizing capacitor Cs, high-speed operation of the phase interpolation circuit becomes difficult. Furthermore, if high-speed operation is difficult, jitter may increase.

Figure 15:
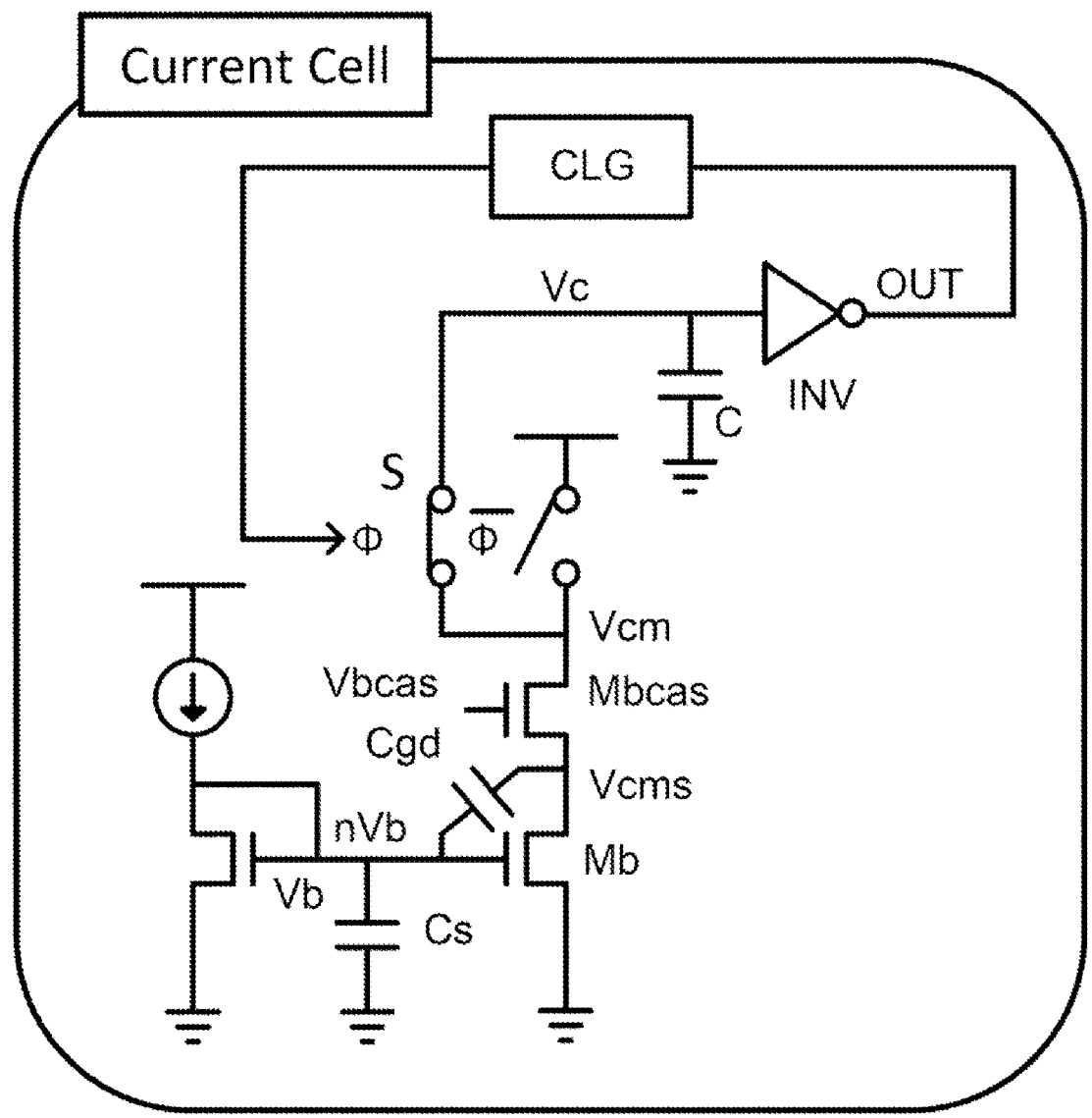
FIG. 15 is a diagram illustrating an equivalent circuit of the phase interpolation circuit (PI) according to the example.
Figure 16:
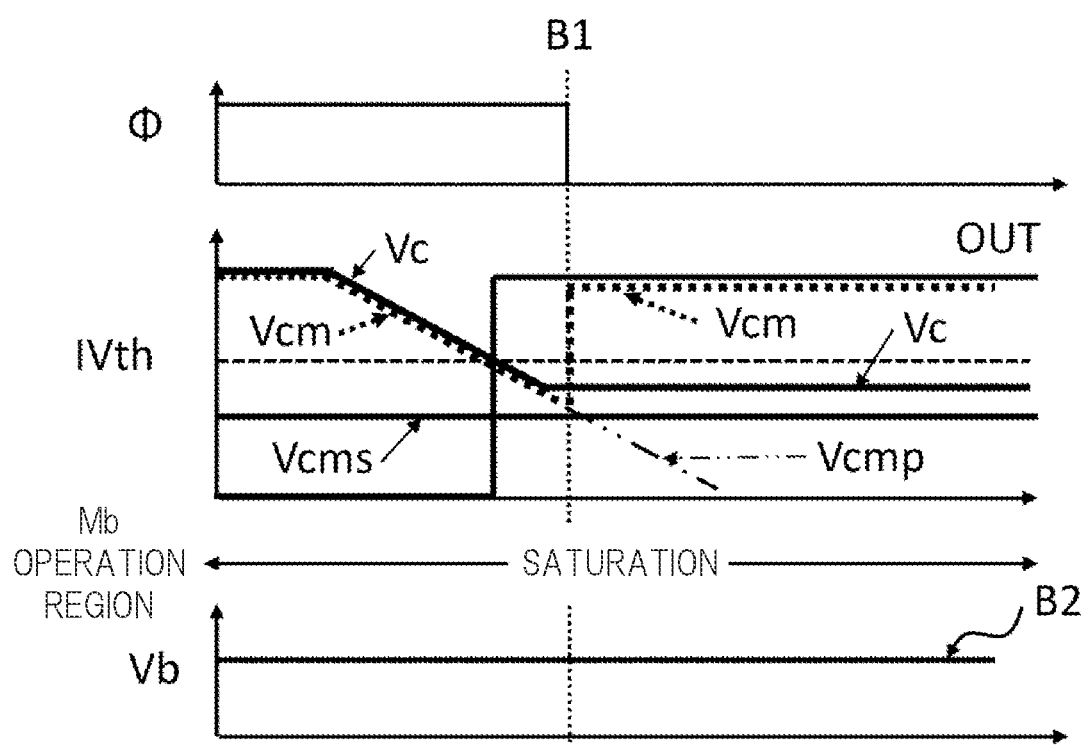
FIG. 16 is a diagram for describing an operation waveform of the phase interpolation circuit (PI) in FIG. 15.

FIG. 15 is a diagram illustrating an equivalent circuit of the phase interpolation circuit (PI) according to the example. FIG. 16 is a diagram for describing an operation waveform of the phase interpolation circuit (PI) in FIG. 15.

As illustrated in FIG. 15, the phase interpolation circuit (PI) is provided with the control logic circuit CLG described in FIG. 3. The control logic circuit CLG receives the output signal OUT at its input, monitors or determines the signal level of the output signal OUT, and outputs the first control signal Φ and the second control signal Φ1. The first control signal Φ is supplied to the CDAC, and the second control signal Φ1 is supplied to the inverter INV. FIG. 15 illustrates the control signal Φ supplied to the CDAC, but the description of the control signal Φ1 is omitted. In addition, the stabilizing capacitor Cs is connected between the gate of the MOSFET Mb and the ground wiring of the ground potential Vss. The value of the stabilizing capacitor Cs is, for example, about 300 fF. If the value of the stabilizing capacitor Cs in FIG. 13 is, for example, about 5 pF, the value of 300 fF of the stabilizing capacitor Cs in FIG. 15 is 6/100, so that the area of the stabilizing capacitor Cs can be reduced to about 6/100.

As illustrated in FIG. 16, (B1) the voltage Vc decreases, and the output signal OUT of the inverter INV is inverted. After the output signal OUT of the inverter INV is inverted, the switch S is controlled at the low level of the control signal Φ output from the control logic circuit CLG, and the voltage Vcm is connected to the power supply wiring to supply the power supply potential Vdd. As a result, the potential of the voltage Vc is held. Also, (B2) since the potential of the voltage Vc is held to prevent the decrease in the voltage Vcms, the MOSFET Mb can be operated in the saturation region. As a result, the fluctuation of the bias voltage Vb is reduced. The changes in the potential Vcmp indicated by the two-dot chain line in FIG. 16 indicate the changes in the voltage Vcm in FIG. 12.

With the phase interpolation circuit (PI) according to the first example, the required stabilizing capacitor Cs can be made small. In addition, the area and time constant can be made smaller than those of the comparative example (higher-speed operation and lower noise). Furthermore, since the switch control is performed by using the output of the control logic circuit CLG, there is no risk of erroneous detection.

Figure 17:
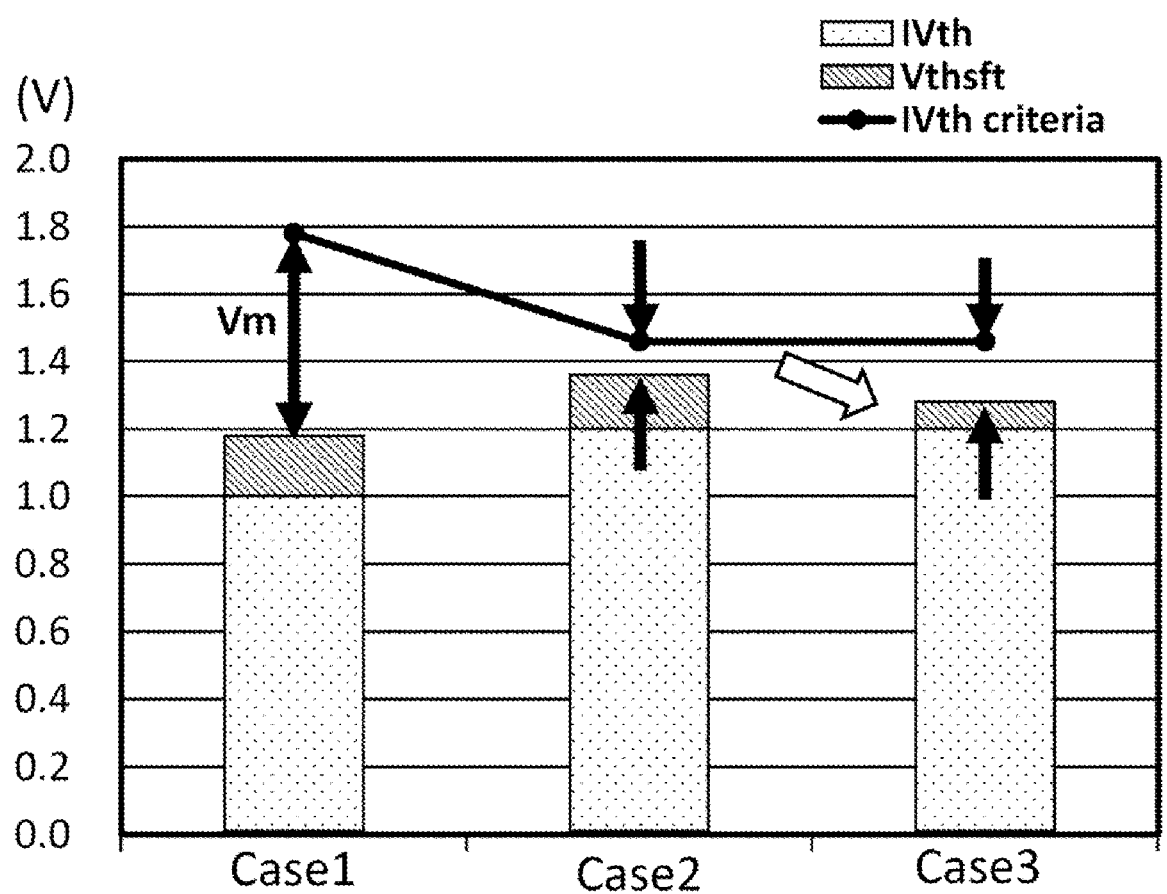
FIG. 17 is a diagram for describing verification results of characteristic degradation due to aging.

FIG. 17 is a diagram for describing verification results of characteristic degradation due to aging. In the technology of semiconductor device manufacturing process, as the process becomes finer, the gate length of the MOSFET is reduced, and the characteristic deterioration of the MOSFET due to aging becomes more problematic.

In FIG. 17, characteristic degradation is verified in the following three cases. Hereinafter, the configuration of FIG. 5 will be described as Feature 1, and the configuration of FIG. 4 will be described as Feature 2.

Case 1: The phase interpolation circuit (PI) is formed by a certain process, and the control signal Φ from the control logic circuit CLG is supplied to the CDAC (see FIG. 5). However, the second control signal Φ1 is not supplied to the inverter INV, and the inverter INV has the configuration of the inverter INVp illustrated in FIG. 9. Case 1 corresponds to a phase interpolation circuit in which only Feature 1 is adopted.

Case 2: The phase interpolation circuit (PI) is formed by a process finer by one generation than in Case 1, and the control signal Φ of the control logic circuit CLG is supplied to the CDAC (see FIG. 5). However, the second control signal Φ1 is not supplied to the inverter INV, and the inverter INV has the configuration of the inverter INVp illustrated in FIG. 9. Case 2 corresponds to a phase interpolation circuit in which only Feature 1 is adopted.

Case 3: The phase interpolation circuit (PI) is formed by a process similar to that of Case 2, the control signal Φ of the control logic circuit CLG is supplied to the CDAC (see FIG. 5), and the second control signal Φ1 of the control logic circuit CLG is supplied to the inverter INV (see FIG. 4). Case 3 corresponds to a phase interpolation circuit in which both Feature 1 and Feature 2 are adopted.

FIG. 17 illustrates a threshold IVth of the inverter INV, a shift Vthsft of the threshold IVth of the inverter INV, and a criteria of the threshold IVth (IVth criteria) of the inverter INV for each case. The voltage Vm between the criteria of the threshold IVth (IVth criteria) and the shift Vthsft indicates an operation margin of the phase interpolation circuit (PI).

When the value of the voltage Vm satisfies Vm≤0, the phase interpolation circuit (PI) cannot operate normally, and the accuracy of the phase interpolation circuit (PI) is greatly deteriorated. In Case 1, the voltage Vm has no problem. In Case 2 with only Feature 1, a sufficient value of the voltage Vm cannot be secured. In Case 3, it can be seen that the voltage Vm can be increased as much as possible by adapting Features 1 and 2 as compared with the voltage Vm in Case 2. That is, it is conceivable that the technique of Feature 2 for suppressing characteristic deterioration due to aging is a technique to be essential as the process becomes finer.

Figure 18:
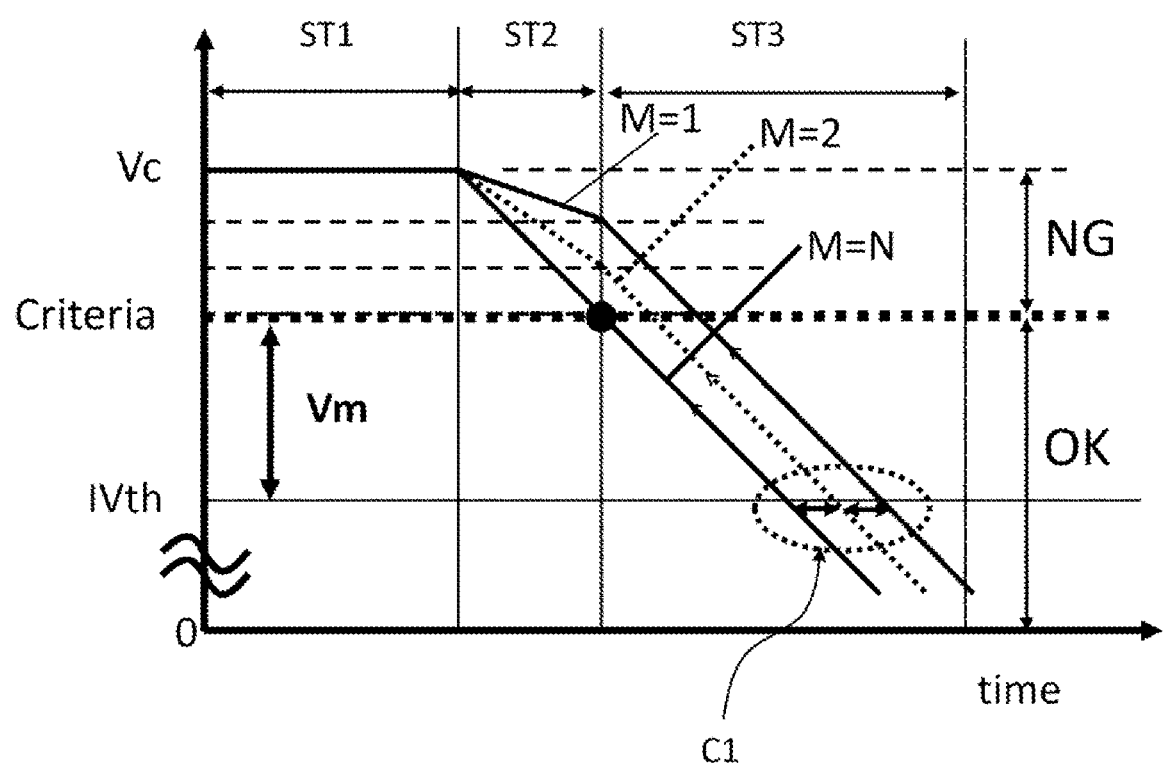
FIG. 18 is a diagram for describing an operation margin (voltage Vm) of the phase interpolation circuit (PI).

FIG. 18 is a diagram for describing an operation margin (voltage Vm) of the phase interpolation circuit (PI) In the design criteria of the phase interpolation circuit PI, at the start of the phase interpolation operation of the phase interpolation circuit PI, the relationship between the minimum voltage (criteria) of the voltage Vc and the threshold IVth of the inverter INV is expressed by the following formula:

That is, the minimum voltage (criteria) of the voltage $Vc-IVth>0$

Here, the minimum voltage (criteria) of the voltage Vc corresponds to, for example, the third state ST3 in FIG. 6, and is the value of the voltage Vc when all the N switches S of the current switch circuits CSW1 to CSWN are turned on and the discharge of the charges of the capacitive element C is completed by using the N currents I (N×I). The term "minimum voltage (criteria) of the voltage Vc−IVth" is the operation margin of the phase interpolation circuit (PI) and is the voltage Vm (minimum voltage (criteria) of the voltage Vc−IVth=Vm: see FIG. 18).

If the operation margin (Vm) of the phase interpolation circuit (PI) is zero or more (Vm>0) (region indicated by OK in FIG. 18), the phase can be equally divided as indicated by C1.

If the operation margin (Vm) of the phase interpolation circuit (PI) is zero or less (Vm<0) (region indicated by NG in FIG. 18), the phase cannot be equally divided, and the phase interpolation circuit (PI) does not operate normally. In addition, noise characteristics are also greatly deteriorated.

Figure 19:
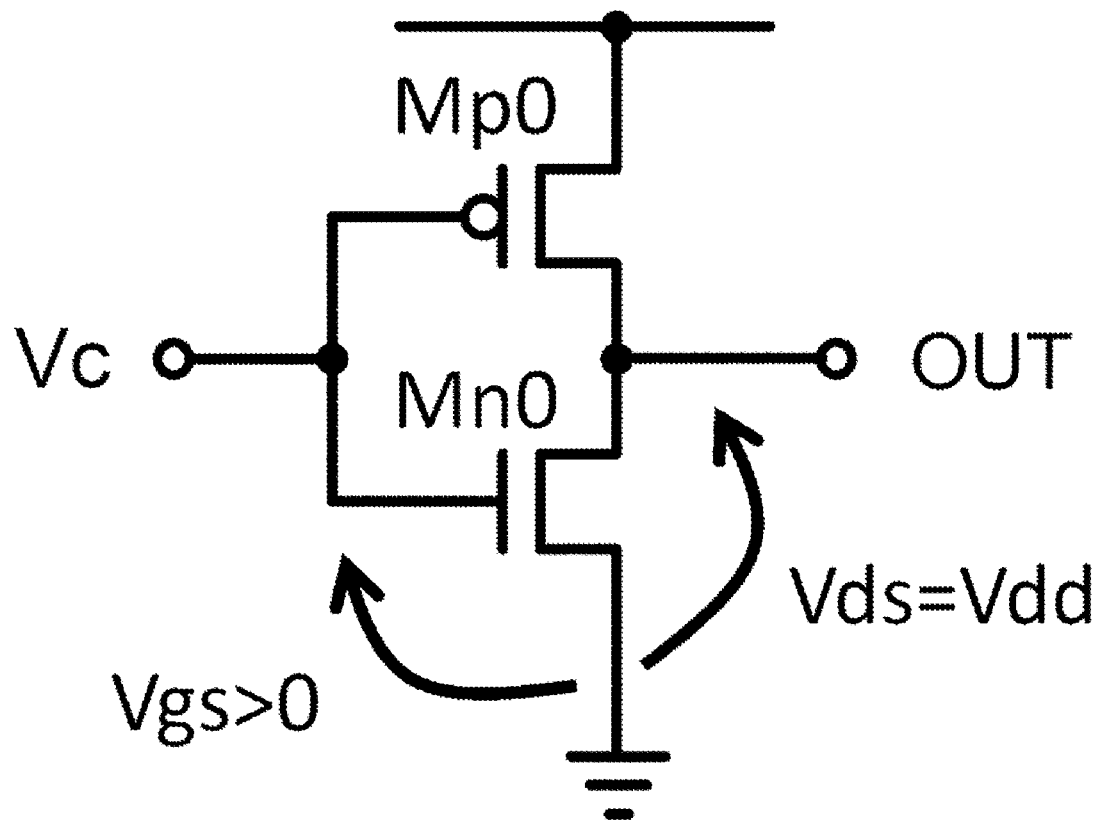
FIG. 19 is a diagram for describing a mechanism of the characteristic deterioration due to aging.
Figure 20:
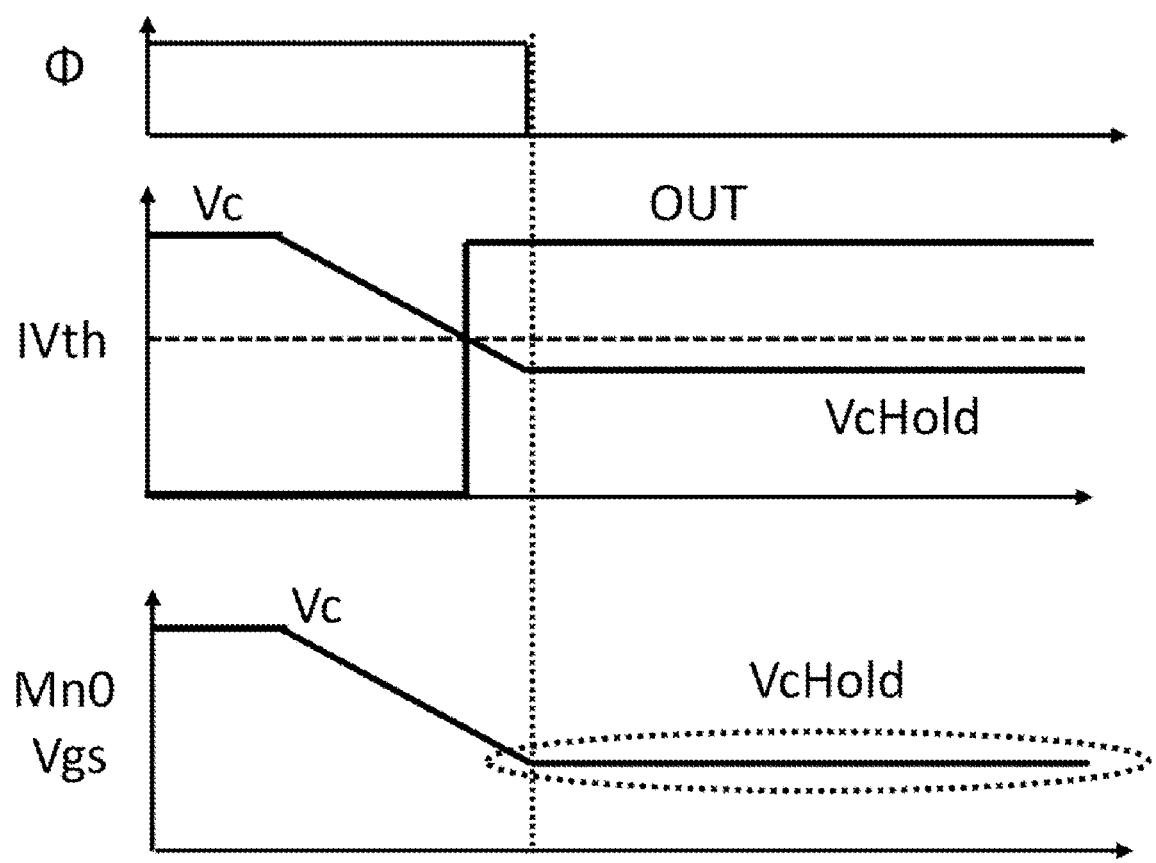
FIG. 20 is a diagram for describing a gate-source potential Vgs of an NMOSFET Mn0 of the inverter INVp.

FIG. 19 is a diagram for describing a mechanism of the characteristic deterioration due to aging. FIG. 20 is a diagram for describing a gate-source potential Vgs of the NMOSFET Mn0 of the inverter INVp. FIG. 19 and FIG. 20 illustrate the phase interpolation circuit (PI) in Case 1 or Case 2, where the inverter is the inverter INVp in FIG. 9 (see FIG. 5 for the CDAC).

In this case, as illustrated in FIG. 19, if the gate-source potential Vgs is equal to or higher than the threshold voltage Vth and the drain-source potential Vds is set to the power supply potential Vdd (Vds=Vdd), the NMOSFET Mn0 of the inverter INVp is affected by hot carrier injection (hereinafter, HCI). As a result, the threshold Vthn of the NMOSFET Mn0 is deteriorated.

As illustrated in FIG. 20, the gate-source potential Vgs of the NMOSFET Mn0 has the same voltage as the voltage Vc. After the output voltage OUT is inverted from the low level to the high level, the voltage Vc is held due to Feature 1 (see FIG. 5). The voltage VcHOLD in the hold state of the voltage Vc is equal to or higher than the threshold voltage Vth. Therefore, the gate-source potential Vgs of the NMOSFET Mn0 is equal to or higher than the threshold voltage Vth (Vgs>Vth). On the other hand, since the output voltage OUT is at the high level (Vdd level), the drain-source potential Vds of the NMOSFET Mn0 becomes the power supply potential Vdd (Vds=Vdd). As a result, the NMOSFET Mn0 is affected by the HCI, and the threshold Vthn of the NMOSFET Mn0 is deteriorated.

Figure 21:
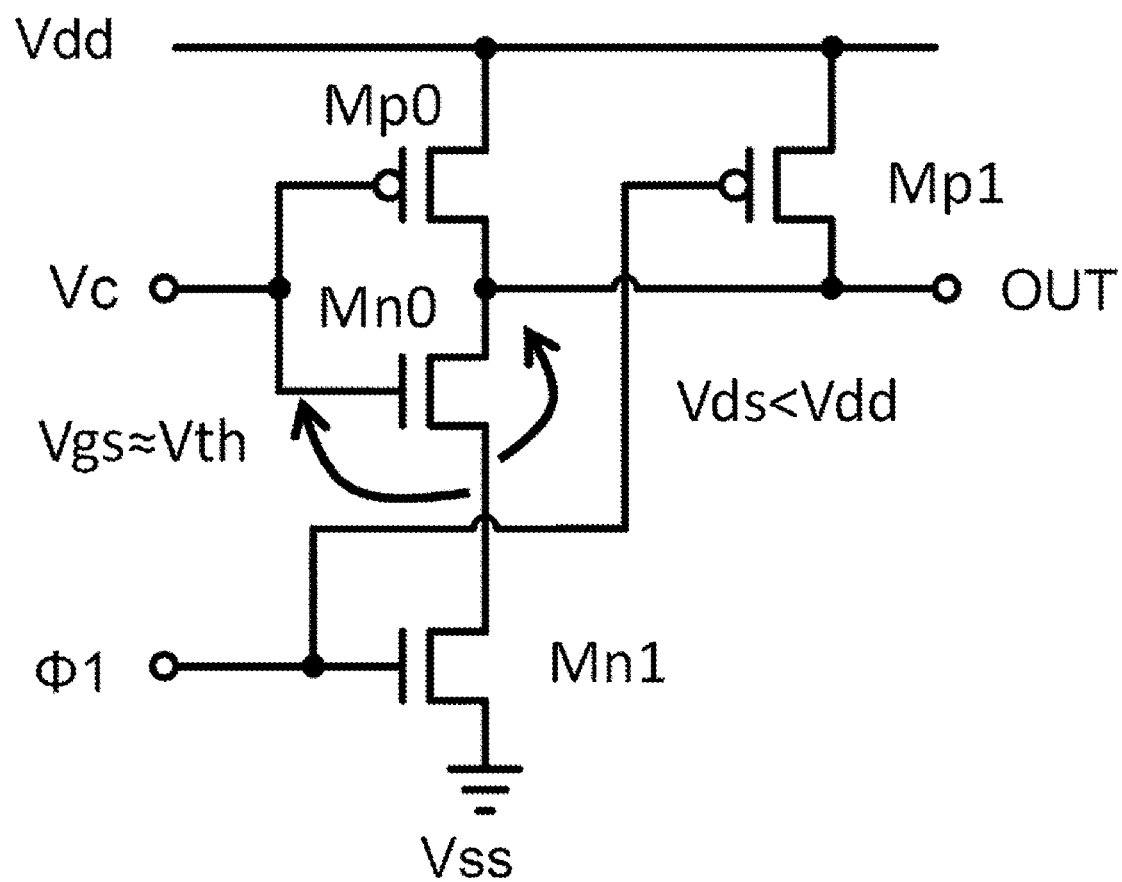
FIG. 21 is a diagram for describing a mechanism for reducing the influence of the characteristic deterioration due to aging.
Figure 22:
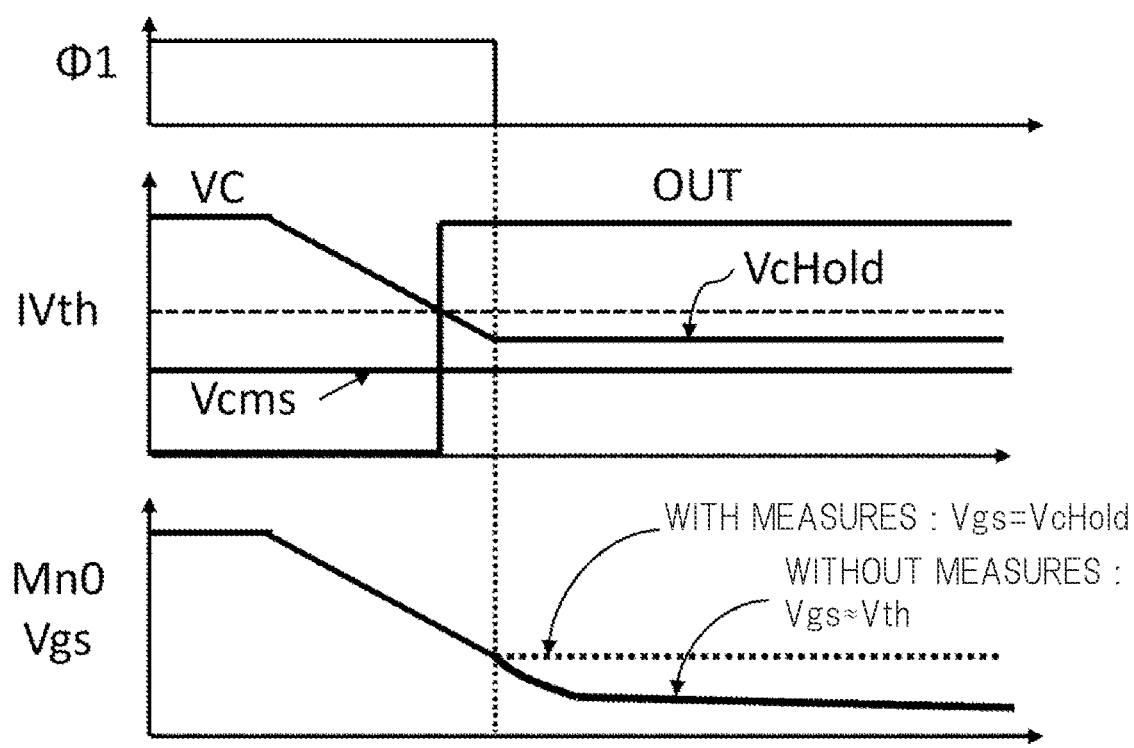
FIG. 22 is a diagram for describing a gate-source potential Vgs of an NMOSFET Mn0 of an inverter INV.

FIG. 21 is a diagram for describing a mechanism for reducing the influence of the characteristic deterioration due to aging. FIG. 22 is a diagram for describing the gate-source potential Vgs of the NMOSFET Mn0 of the inverter INV. FIG. 21 and FIG. 22 illustrate the phase interpolation circuit (PI) in Case 3, and the inverter is the inverter INV of FIG. 4 (see FIG. 5 for the CDAC).

In this case, as illustrated in FIG. 21, the MOSFET Mp1 and the MOSFET Mn1 are turned on and off based on the change of the control signal Φ1 from the high level to the low level. Therefore, in the NMOSFET Mn0, the gate-source potential Vgs is about the threshold voltage Vth, and the drain-source potential Vds is equal to or lower than the power supply potential Vdd (Vds<Vdd). As a result, deterioration of the threshold Vthn of the NMOSFET Mn0 is reduced. That is, when the inverter INV enters the stop mode based on the low level of the control signal Φ1, the ground potential Vss of the inverter INV is cut off by the MOSFET Mn1, and the operating voltage is not applied to the gate-source potential Vgs and the drain-source potential Vds of the MOSFET Mn0 constituting the inverter INV. Note that the configuration in which the power supply potential Vdd of the inverter INV is cut off when the inverter INV enters the stop mode based on the low level of the control signal Φ1 is also possible.

As illustrated in FIG. 22, the control logic circuit CLG detects that the output voltage OUT has been inverted from the low level to the high level, and sets the control signal Φ1 from the high level to the low level. The MOSFET Mn1 is turned off by the low level of the control signal Φ1. As a result, the inverter INV turns off by itself. When the voltage Vc is in the hold state (voltage VcHOLD), the gate-source potential Vgs of the NMOSFET Mn0 at the time of voltage hold is about the threshold voltage Vth, and the drain-source voltage is equal to or lower than VDD, so that deterioration of the threshold Vthn of the NMOSFET Mn0 can be reduced. After the inverter INV turns off by itself, the potential of the output voltage OUT is fixed at the Vdd level, so that no malfunction occurs.

Note that the capacitive element C may be connected to Vdd. Also, the CDAC may be composed of a P channel MOSFET. The configuration in which the inverter INV that turns off by itself blocks the PMOSFET Mp0 on the Vdd side is also possible. In addition, the fixed potential of the output voltage OUT of the inverter INV that turns off by itself can be set to the ground potential Vss.

According to the first example, the following advantageous effects can be obtained.

(1) Feature 1: After the end of the phase interpolation operation, the current source is always turned on by the control logic circuit CLG, and the path of the current is switched by the control of the MOSFET M1 and the MOSFET M2 of the current switch circuit CSW, so that the fluctuation of the bias voltage of the current source can be reduced. As a result, it is possible to increase the accuracy of the phase interpolation circuit without increasing the area and deteriorating the noise performance.

(2) Feature 2: Since the inverter INV for threshold determination is turned off by the control logic circuit CLG after the end of the phase interpolation operation, the gate-source potential Vgs and the drain-source potential Vds of the NMOSFET Mn0 for threshold determination can be reduced. As a result, it is possible to suppress the deterioration of the threshold of the NMOSFET Mn0 due to the bias temperature instability (BTI: aging phenomenon of transistor) and the HCI.

(3) Consequently, it is possible to provide a semiconductor device including a phase interpolation circuit with a small area and capable of operating at a high speed.

Second Example

Figure 23:
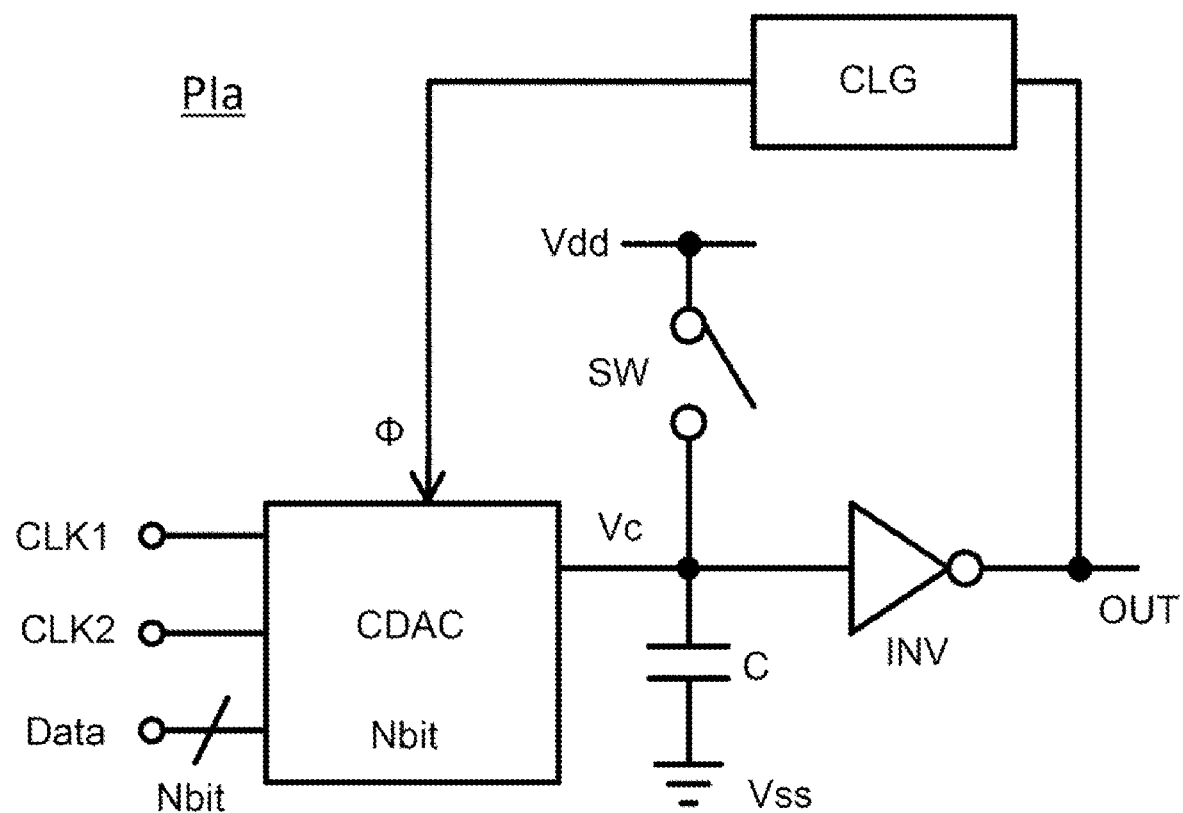
FIG. 23 is a diagram illustrating a circuit configuration of a phase interpolation circuit (PIa) according to the second example.

Next, the second example will be described with reference to FIG. 23. FIG. 23 is a diagram illustrating a circuit configuration of a phase interpolation circuit (PIa) according to the second example. The phase interpolation circuit (PIa) illustrated in FIG. 23 is different from the phase interpolation circuit (PI) illustrated in FIG. 3 in that the control logic circuit CLG does not generate the control signal Φ1 to the inverter INV. In FIG. 23, the CDAC has the configuration illustrated in FIG. 5, and the inverter INV has the configuration illustrated in FIG. 9. The other configuration and advantageous effects of the phase interpolation circuit (PIa) illustrated in FIG. 23 are the same as the configuration and advantageous effects of the phase interpolation circuit (PI) illustrated in FIG. 3, and therefore repetitive description will be omitted. As a result, the interpolation operation of the phase interpolation circuit (PIa) can be made highly accurate. The capacitive element C may be connected to the Vdd. Also, the CDAC may be composed of a P channel MOSFET.

Third Example

Figure 24:
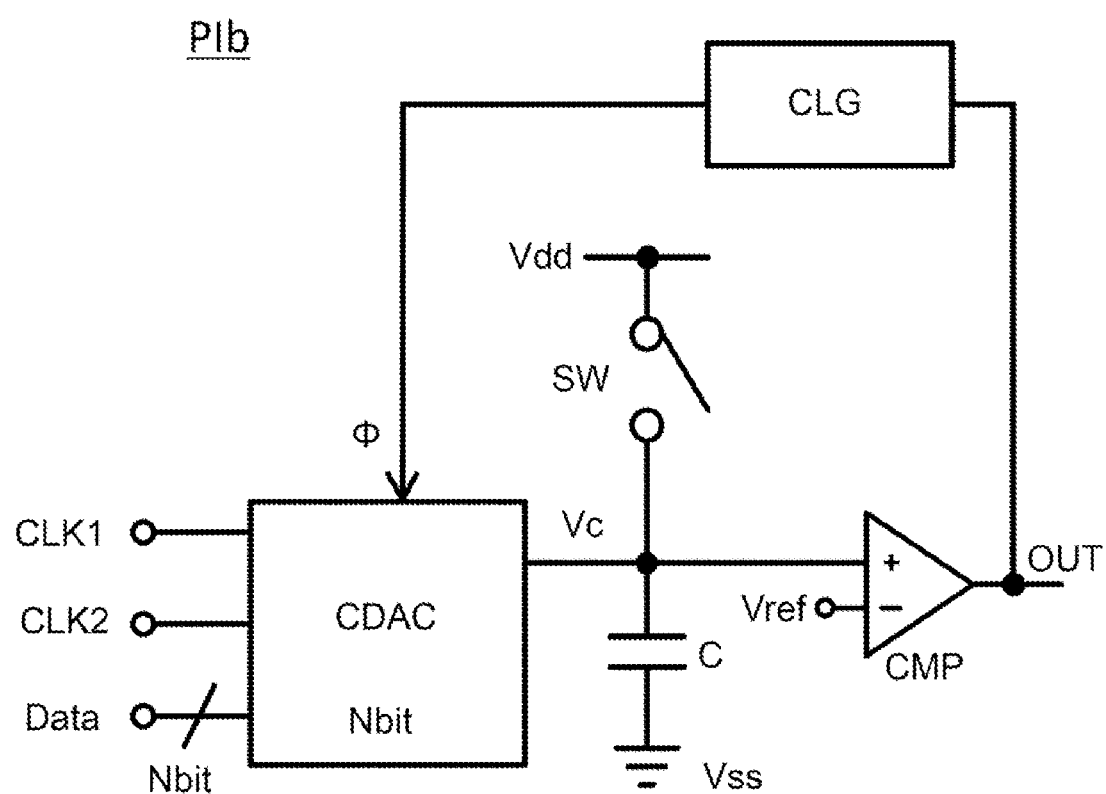
FIG. 24 is a diagram illustrating a circuit configuration of a phase interpolation circuit (PIb) according to the third example.

Next, the third example will be described with reference to FIG. 24. FIG. 24 is a diagram illustrating a circuit configuration of a phase interpolation circuit (PIb) according to the third example. The phase interpolation circuit (PIb) illustrated in FIG. 24 is different from the phase interpolation circuit (PIa) illustrated in FIG. 23 in that the inverter INV is replaced by a comparison circuit CMP. The other configuration and advantageous effects of the phase interpolation circuit (PIb) illustrated in FIG. 24 are the same as the configuration and advantageous effects of the phase interpolation circuit (PIa) illustrated in FIG. 23, and therefore repetitive description will be omitted. The capacitive element C may be connected to the Vdd. Also, the CDAC may be composed of a P channel MOSFET.

Application Examples

The phase interpolation circuits (PI, PIa, and PIb) in the first to third examples can be applied to the fractional frequency divider FDIV of the PLL circuit 1 illustrated in FIG. 1. In this case, the PLL circuit 1 is a PLL circuit having a fractional multiplication function.

A global navigation satellite system (GNSS), which is means for accurately grasping a vehicle position, has become important in ADAS and automatic driving systems. On the other hand, the radio wave of an artificial satellite used for GNSS is as weak as about −130 dBm, and electromagnetic (EMI) noise generated by an in-vehicle semiconductor device IC may interfere with reception by GNSS, so that the reduction of EMI noise has been required. The requirement for reducing the EMI noise can be satisfied by improving the frequency resolution by the use of the PLL circuit 1 having the fractional multiplication function according to first to third examples for the in-vehicle semiconductor device IC.

In addition, if the PLL circuit 1 has a fractional multiplication function, the PLL circuit 1 can also have a spread spectrum clock generator (SSCG) function. The SSCG can further reduce the EMI noise by spreading the spectrum to disperse power.

The invention made by the inventors has been specifically described above based on examples. However, it is needless to say that the present invention is not limited to the above embodiments and examples, and the present invention can be modified in various manners.

What is claimed is:

1. A semiconductor device comprising:
a phase interpolation circuit including an N-bit current digital-analog conversion circuit, a switch circuit, a capacitive element, a comparison circuit, and a control logic circuit,
wherein an output of the N-bit current digital-analog conversion circuit is connected to a node between the switch circuit and the capacitive element,
wherein an input of the comparison circuit is connected to the node between the switch circuit and the capacitive element,
wherein the control logic circuit is connected to the N-bit current digital-analog conversion circuit and the comparison circuit,
wherein the control logic circuit is configured to detect an end of a phase interpolation operation by using an output result of the comparison circuit and output a control signal for turning off the comparison circuit, and
wherein the comparison circuit has an operation mode in which a value of an input voltage is compared and a stop mode in which a fixed voltage level is output regardless of the value of the input voltage.

2. The semiconductor device according to claim 1,
wherein, when the comparison circuit enters the stop mode in response to the control signal, a power supply potential or a ground potential of the comparison circuit is cut off, and an operating voltage is not applied to a gate-source voltage and a drain-source voltage of a MOSFET constituting the comparison circuit.

3. The semiconductor device according to claim 1,
wherein the comparison circuit is composed of an inverter.

4. A semiconductor device comprising:
a phase interpolation circuit including an N-bit current digital-analog conversion circuit, a switch circuit, a capacitive element, an inverter, and a control logic circuit,
wherein an output of the N-bit current digital-analog conversion circuit is connected to a node between the switch circuit and the capacitive element,
wherein an input of the comparison circuit is connected to the node between the switch circuit and the capacitive element,
wherein the control logic circuit is connected to the N-bit current digital-analog conversion circuit and the comparison circuit, and
wherein the control logic circuit is configured to detect an end of a phase interpolation operation by using an output result of the inverter, output a first control signal for turning off the current digital-analog conversion circuit, and output a second control signal for turning off the inverter.

5. The semiconductor device according to claim 4,
wherein, when the inverter is turned off in response to the second control signal, a power supply potential or a ground potential of the inverter is cut off, and an operating voltage is not applied to a gate-source voltage and a drain-source voltage of a MOSFET constituting the inverter.

6. A semiconductor device comprising:
a phase interpolation circuit including an N-bit current digital-analog conversion circuit, a switch circuit, a capacitive element, an inverter, and a control logic circuit,
wherein an output of the N-bit current digital-analog conversion circuit is connected to a node between the switch circuit and the capacitive element,
wherein an input of the comparison circuit is connected to the node between the switch circuit and the capacitive element,
wherein the control logic circuit is connected to the N-bit current digital-analog conversion circuit and the comparison circuit, and
wherein the control logic circuit is configured to detect an end of a phase interpolation operation by using an output result of the inverter and output a first control signal for turning off the current digital-analog conversion circuit.

7. The semiconductor device according to claim 6,
wherein the control logic circuit is configured to detect the end of the phase interpolation operation by using the output result of the inverter and output a second control signal for turning off the inverter.

8. The semiconductor device according to claim 7,
wherein, when the inverter is turned off in response to the second control signal, a ground potential of the inverter is cut off, and an operating voltage is not applied to a gate-source voltage and a drain-source voltage of a MOSFET constituting the inverter.

* * * * *